(12) United States Patent
Sarile et al.

(10) Patent No.: US 11,710,661 B2
(45) Date of Patent: Jul. 25, 2023

(54) SEMICONDUCTOR PACKAGES AND METHODS OF PACKAGING SEMICONDUCTOR DEVICES

(71) Applicant: UTAC Headquarters Pte. Ltd., Singapore (SG)

(72) Inventors: Enrique Jr Sarile, Singapore (SG); Dzafir Bin Mohd Shariff, Singapore (SG); Seung Geun Park, Singapore (SG); Ronnie M. De Villa, Singapore (SG); Zhong Hai Wang, Singapore (SG)

(73) Assignee: UTAC Headquarters Pte. Ltd, Singapore (SG)

( * ) Notice: Subject to any disclaimer, the term of this patent is extended or adjusted under 35 U.S.C. 154(b) by 120 days.

(21) Appl. No.: 17/072,006

(22) Filed: Oct. 15, 2020

(65) Prior Publication Data
US 2021/0118738 A1    Apr. 22, 2021

Related U.S. Application Data

(60) Provisional application No. 62/916,792, filed on Oct. 17, 2019.

(51) Int. Cl.
*H01L 21/78* (2006.01)
*H01L 23/31* (2006.01)
*H01L 23/00* (2006.01)

(52) U.S. Cl.
CPC .......... *H01L 21/78* (2013.01); *H01L 23/3192* (2013.01); *H01L 23/564* (2013.01)

(58) Field of Classification Search
CPC ... H01L 21/78; H01L 23/3192; H01L 23/564; H01L 2221/68327; H01L 21/02076; H01L 21/6836; H01L 23/3157; H01L 23/4827
See application file for complete search history.

(56) References Cited

U.S. PATENT DOCUMENTS

2003/0104679 A1 *  6/2003  Dias ............... H01L 21/6836
                                                    257/E29.022

* cited by examiner

*Primary Examiner* — Thanh T Nguyen

(57) ABSTRACT

A semiconductor package is disclosed. The semiconductor package includes a substrate with a first surface, a second surface and sidewalls. The package also includes backside metallization (BSM) over the second surface of the substrate. The semiconductor package is devoid of metal debris.

20 Claims, 39 Drawing Sheets

SEMICONDUCTOR PACKAGES AND METHODS OF PACKAGING SEMICONDUCTOR DEVICES

CROSS-REFERENCE TO RELATED APPLICATION

This application claims the benefit of U.S. Provisional Application Ser. No. 62/916,792, filed on Oct. 17, 2019, which is herein incorporated by reference in its entirety for all purposes.

FIELD OF THE INVENTION

The present invention generally relates to a semiconductor package. More specifically, the present invention is directed to a semiconductor package with minimized debris.

BACKGROUND

The recent rapid dissemination of smartphones and other mobile and wearable electronic terminals reflects the demand for faster and smaller products. The growing demand for faster and smaller products concomitantly requires semiconductor packages to have small footprints. Wafer level packaging (WLPs), such as wafer level chip scale packaging (WLCSPs) has been employed. In WLPs, packaging of the chips is performed at the wafer level prior to singulation. After packaging is completed, the wafer is diced to singulate the wafer into individual chip packages.

A wafer may include backside metallization (BSM). For example, a metal stack may be formed on the backside of the wafer. BSM is employed to meet power, speed, reliability as well as improved circuit performance. BSM enables the semiconductor package to be optimized for electrical, mechanical, and thermal requirements. For example, the wafer with the dies may be thinned to improve circuit performance. The BSM improves the mechanical strength of the thinned wafer and thermal dissipation.

However, one problem with conventional singulation processes of a wafer with BSM is that metal debris from the BSM remains on the packages. The metal debris can negatively impact package reliability, including package failures due to electrical shorts.

From the foregoing discussion, there is a desire to provide a more reliable package with minimized debris.

SUMMARY

An embodiment related to a semiconductor package is disclosed. The semiconductor package includes a substrate with a first surface, a second surface and sidewalls. The package also includes backside metallization (BSM) over the second surface of the substrate. A sidewall profile of the semiconductor package includes a deburred surface.

Another embodiment related to a method of forming a device is disclosed. The method includes providing a substrate with a first surface, a second surface and sidewalls. Backside metallization (BSM) is deposited over the second surface of the substrate. A deburred surface is formed on a sidewall profile of the semiconductor package to remove metal debris.

In yet another embodiment, a semiconductor package disclosed herein includes a substrate with a first surface, a second surface and sidewalls. The package also includes backside metallization (BSM) over the second surface of the substrate. The semiconductor package is devoid of metal debris.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 6a-6m show cross-sectional views of yet another embodiment of a process for forming a semiconductor package.

DETAILED DESCRIPTION

Embodiments relate to semiconductor packages and methods for forming semiconductor packages. More particularly, embodiments relate to singulated semiconductor packages and methods for singulating semiconductor packages. In one embodiment, the semiconductor package includes a WLP, such as WLCSP. A WLCSP may be formed by packaging semiconductor chips at the wafer level followed by separation of individual chip packages from the wafer.

The package, for example, may include one or more semiconductor dies or chips such as integrated circuits (ICs). The die in the WLCSP may include interconnects containing layers of metal traces and dielectric materials on one major surface of the die, such as the top or active surface. The die in the WLCSP may be electrically connected to an external circuit, such as a printed circuit board (PCB), by a plurality of solder balls extending between the interconnects and the external circuit.

In one embodiment, the WLCSP includes BSM on a back or inactive surface of the wafer. The backside metallization may include a single layer of metal or a BSM stack having a plurality of metal layers. The backside metallization, for example, may include various types of metal layers, such as gold, silver, nickel, chromium, titanium, tungsten, vanadium, other metals and alloys thereof. The backside metallization, for example, may serve to improve mechanical strength and heat dissipation of the dies. Other types of packages may also be useful. Such packages may be incorporated into electronic products or equipment, including vehicles.

Figure 1:
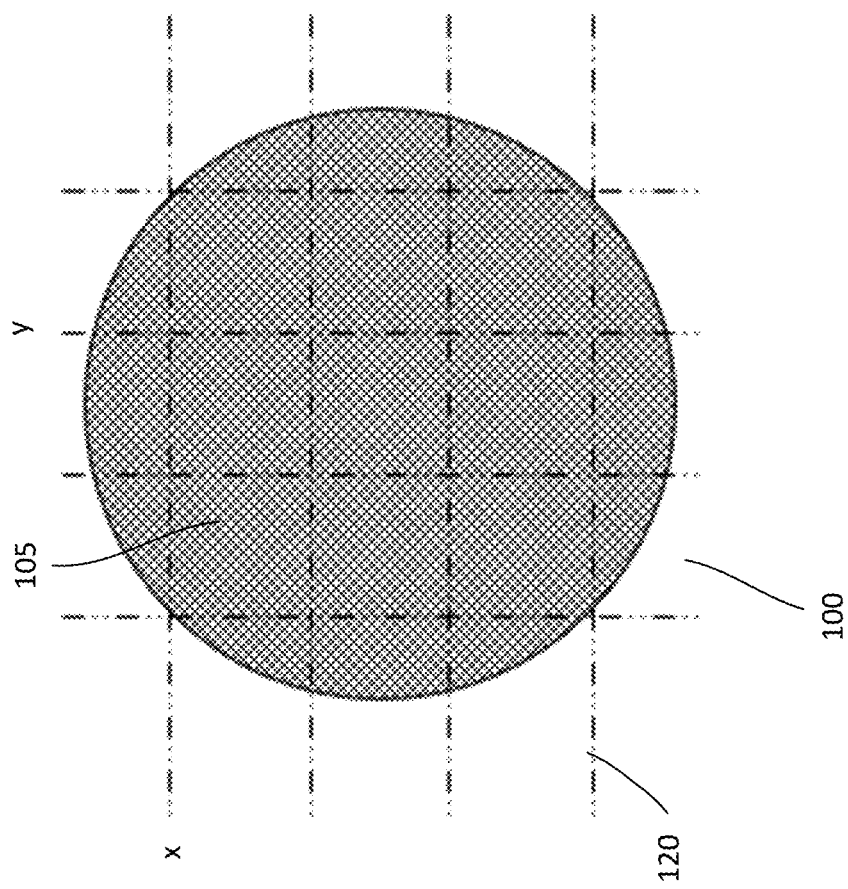
FIG. 1 shows a simplified top view of a semiconductor wafer.

FIG. 1 shows a simplified top view of a semiconductor wafer 100. The wafer may be a lightly doped p-type silicon wafer. Other types of wafers may also be employed. A plurality of devices 105 are formed on an active surface of the wafer. For example, the active surface may be the top surface of the wafer while the inactive surface may be the bottom surface. The devices are arranged in rows along a first (x) direction and columns along a second (y) direction. After processing of the wafer is completed, for example, after formation of the interconnects and BSM, the wafer may be diced along the dicing streets 120 in the x and y directions to singulate the devices into individual dies 105.

FIG. 2a-2e shows simplified cross-sectional views of various embodiments of a singulated semiconductor package 200 along A-A'. The semiconductor package, for example, may be a rectangular-shaped package, with the same or similar sidewall profiles on all sides. The semiconductor package may include a semiconductor die. The semiconductor die may include a substrate, such as a silicon substrate or wafer. The substrate includes opposing top and bottom sides. Circuit components are formed on the top side of the substrate. The top side or frontside may be referred to as the active side or active surface of the substrate. The opposing bottom side or backside may be referred to as the inactive side or inactive surface of the substrate.

A back-end-of-line (BEOL) dielectric with interconnects is formed over the active surface of the substrate. For example, the BEOL may cover the active components. The BEOL includes multiple metal or interconnect levels of metal lines and via contacts separated by dielectric material or layers for interconnecting the circuit components. The top interconnect level may serve as the pad level with contact pads for providing external connections.

A passivation stack may be provided over the BEOL dielectric. The passivation stack, for example, may include a combination of dielectric layers, such as silicon oxide and silicon nitride layers. Other types of dielectric layers may also be useful. As shown, the dielectric stack includes first and second passivation layers 140 and 150. The first passivation layer may be the bottom passivation layer on the BEOL and the second passivation layer may be the top passivation layer. The first passivation layer 140 may be 2 μm. The second passivation layer 150 may be 5 μm. Providing a passivation stack with other numbers of passivation layers may also be useful. Pad openings are formed in the passivation stack to expose die contact pads on the top interconnect level for external die connections. The passivation stack, for example, may serve as a protective stack, protecting the die from moisture and corrosion.

In one embodiment, the bottom or inactive surface of the wafer 110 includes BSM 160. The BSM may include a single layer of metal or a metal stack having a plurality of metal layers. The BSM may include, for example, gold, silver, chromium, titanium, tungsten, vanadium, nickel, other metals and alloys thereof. The BSM may be formed by chemical vapor deposition, sputter deposition, e-beam evaporation or plating. Other techniques may also be useful.

As shown, the BSM includes first and second metal layers 120 and 130. The first metal layer is disposed on the inactive wafer surface and the second metal layer is disposed on the first metal layer. In one embodiment, the first metal layer is a silver layer while the second metal layer is a nickel layer. The thickness of the first metal layer may be about 50 μm while the second metal layer may be about 30 μm thick. Other numbers, types, thicknesses or configurations of metal layers may also be useful.

The top surface of the passivation stack may be referred to as the top or active die surface 151 and the inactive wafer surface may be referred to as the bottom or inactive die surface 132. In some cases, through silicon vias contacts may be provided in the wafer to provide die contact pads on the inactive die surface. In other cases, die contact pads may be provided on both the active and inactive die surfaces.

As part of the singulation process, the wafer may be subjected to multiple cutting processes. The cutting processes may, for example, include laser etching using a protective coating, chemical etching using an etch mask, such as reactive ion etching using a patterned photoresist mask, or a combination thereof. Other types of cutting processes may also be useful. In one embodiment, a deburring process is employed to remove metal debris from the package sidewalls. In some embodiments, multiple deburring processes are employed. A deburring process, in one embodiment, includes a laser deburring process. The deburring process may be achieved by beam splitting of a laser beam of a laser tool. The laser etching and deburring process may be carried out by the same laser tool. Other types of deburring processes may also be useful. The deburring process leaves the sidewalls of the dies with deburred surfaces. For example, the deburred surfaces may be slanted or beveled surfaces, producing a sidewall profile having a combination of angled (deburred) and vertical (non-deburred) portions.

Figure 2A:
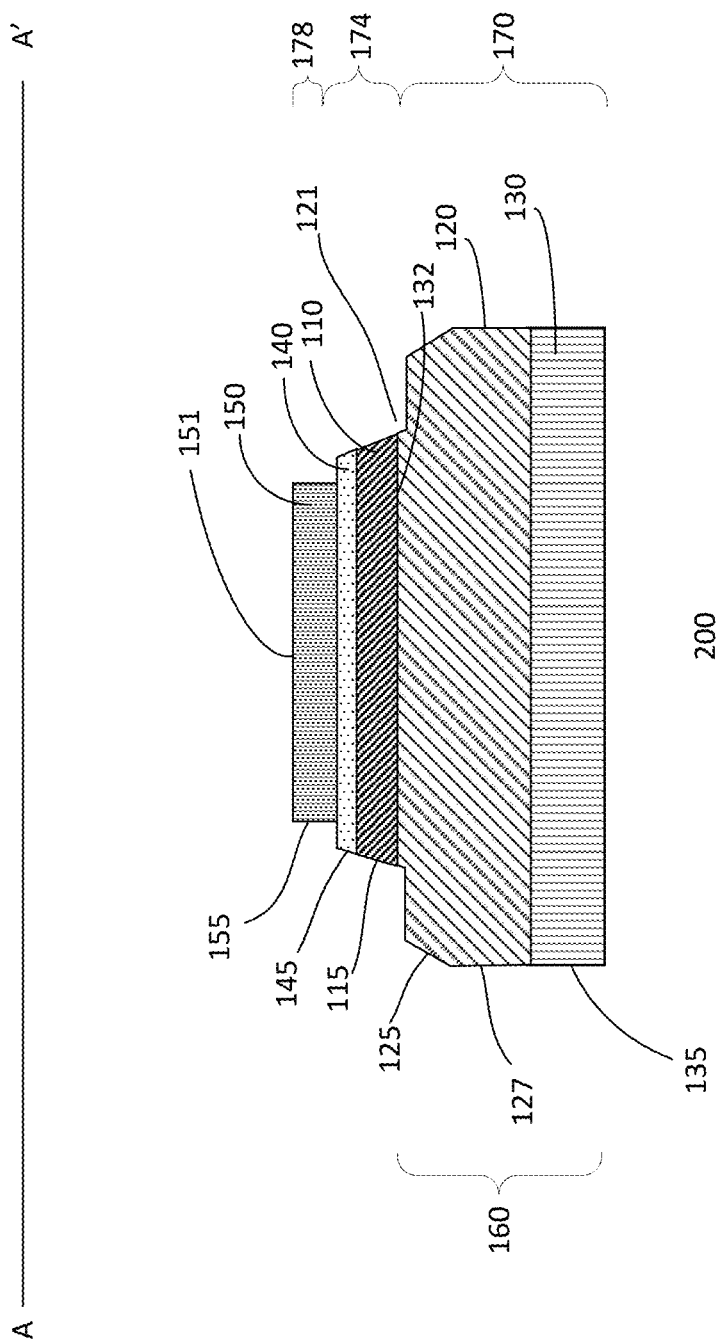
FIG. 2a-2e show simplified cross-sectional views of various embodiments of a singulated chip package.

Referring to FIG. 2a, sidewall profiles of an embodiment of a packaged die 200 is shown. The sidewall profiles include vertical and slanted portions. As shown, the sidewall profiles of the four sides of the die package are the same or about the same. Slight variations or differences may occur due to process variations.

As shown, a sidewall profile of a side of the package includes a top portion 178 with a vertical or substantially vertical sidewall, an intermediate portion 174 with a slanted sidewall, and a bottom portion 170 in which the upper part includes a slanted sidewall and the lower part includes a vertical or substantially vertical sidewall. In one embodiment, the slanted sidewalls are deburred surfaces while vertical or substantially vertical sidewalls are non-deburred surfaces. As shown, the top portion is recessed from the intermediate portion and the intermediate portion is recessed from the bottom portion.

In one embodiment, the top portion 178 of the sidewall profiles is created with an open process. The open process, in one embodiment, is performed on the second or top passivation layer 150. The open process, for example, may be a reactive-ion etching (RIE) using a photoresist mask. The RIE patterns the top passivation layer to form openings along the x and y dicing streets of the wafer. The RIE forms trenches at the dicing street in the second passivation layer. The RIE stops at the first or bottom passivation layer 140. For example, the first passivation layer may serve as an etch stop for the RIE. The RIE forms trenches with vertical or substantially vertical sidewalls 155 in the top passivation layer. In the case of multiple top passivation layers, the RIE may etch the top passivation layers, forming a vertical or substantially vertical sidewall profile. The vertical or substantially vertical sidewalls of the second passivation layers serve as the top portion of the sidewall profiles.

As for the intermediate portion 174, it is created by a grooving process. The grooving process, for example, may be a laser grooving process, such as laser etching. In one embodiment, the laser etches the first passivation layer 140 and the wafer 110 with the BEOL dielectric. The wafer with the BEOL dielectric may be collectively referred to as the wafer.

In one embodiment, the grooving process forms grooves along the x and y dicing streets within the trenches of the second passivation layer. The grooves, in one embodiment, include vertical or substantially vertical sidewalls. The grooves are narrower than the trench openings of the second passivation layer. This results in the sidewalls of the second passivation layer being recessed from the sidewalls of the first passivation layer and substrate.

In one embodiment, the laser over etches the wafer, etching into the BSM. The laser over etch forms a step 121 in the BSM below the wafer. The over etch causes metal debris to be deposited on the sidewalls of the wafer. A deburring process is performed. The deburring process forms deburred surfaces 115 and 145 on the exposed wafer and first passivation layer sidewalls. The sidewall portion of the BSM surface at the step 121 may also be slanted due to the deburring process. The deburred surfaces are beveled or slanted surfaces, creating a slanted or beveled sidewall profile for the wafer and first passivation layer sidewalls. The deburred surfaces of the first passivation layer and wafer serve as the intermediate portion 174 of the sidewall profiles.

The bottom portion 170 of the sidewall profiles is generated by a cutting or dicing process. The dicing process cuts the BSM 160 to singulate the die packages. In one embodiment, the dicing process is a laser etching process. The laser etches the BSM, forming vertical or substantially vertical sidewalls for the BSM. The laser dicing process is narrower than the laser grooving process. This results in the sidewalls of the first passivation layer and wafer being recessed from the sidewalls of the BSM.

The laser dicing process causes metal debris to be deposited on the sidewalls of the BSM near the interface of the BSM and wafer. For example, metal debris may be deposited on the upper portion of the BSM, such as on the upper portion of the first metal layer 120. A deburring process is performed. The deburring process forms deburred surfaces 125 on the sidewalls of the BSM. The deburred surfaces, for example, may be formed on the upper portion of the BSM, such as the upper portion of the first metal layer 120 of the BSM. The deburred surfaces are beveled or slanted surfaces, creating a slanted or beveled sidewall profile in the upper part of the BSM and a vertical or substantially vertical sidewall profile for the lower part of the BSM. For example, the lower part of the first metal layer 120 and the second metal layer may include vertical or substantially vertical sidewalls 127 and 135. The deburred (beveled or slanted) and vertical or substantially vertical surfaces of the BSM serve as the bottom portion of the sidewall profiles.

Figure 2B:
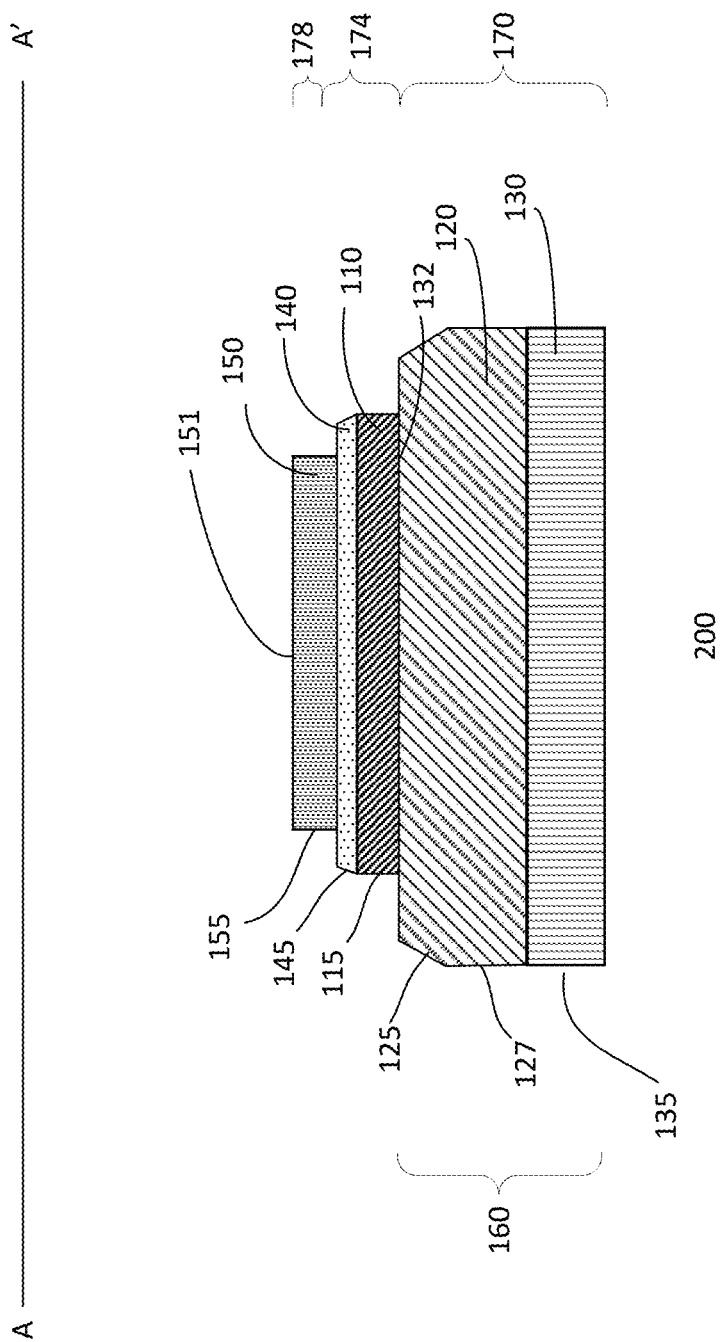

FIG. 2b shows sidewall profiles of another embodiment of a packaged die 200. The sidewall profiles include vertical and slanted portions. As shown, the sidewall profiles of the four sides of the die package are the same or about the same. Slight variations or differences may occur due to process variations. The sidewall profiles of the packaged die are similar to the sidewall profiles described in FIG. 2a. Common elements may not be described or described in detail.

As shown, a sidewall profile of a side of the package includes a top portion 178 with a vertical or substantially vertical sidewall, an intermediate portion 174 having an upper intermediate part with a slanted sidewall and a lower intermediate part with a vertical or substantially vertical sidewall, and a bottom portion 170 in which the upper bottom part includes a slanted sidewall and the lower bottom part includes a vertical or substantially vertical sidewall. In one embodiment, the slanted sidewalls are deburred surfaces while vertical or substantially vertical sidewalls are non-deburred surfaces. In some cases, a slanted surface may be a laser etched surface. As shown, the top portion is recessed from the intermediate portion and the intermediate portion is recessed from the bottom portion.

In one embodiment, the top portion 178 of the sidewall profiles is created with an open process, as described in FIG. 2a. The vertical or substantially vertical sidewalls 155 of the second passivation layer 150 serve as the top portion of the sidewall profiles.

As for the intermediate portion 174, it is created by a grooving process. The grooving process, for example, may include a laser etching process and a chemical etching process, such as RIE. In one embodiment, the laser etching patterns the first passivation layer and an RIE patterns the wafer (including the BEOL dielectric). The laser etching of the first passivation layer 140 forms slanted sidewall surfaces 145 for the first passivation layer while the RIE forms vertical or substantially vertical sidewalls 115 for the wafer 110. The RIE employs a protective layer over the first passivation layer as an etch mask. This results in the sidewalls of the second passivation layer being recessed from the sidewalls of the first passivation layer and wafer.

The RIE stops on the BSM. The use of RIE avoids metal debris deposited on the sidewalls 115 of the wafer. As such, no deburring process is required. The slanted sidewalls 145 of the first passivation layer 140 and vertical or substantially vertical sidewalls 115 of the wafer 110 serve as the intermediate portion 174 of the sidewall profiles.

The bottom portion 170 of the sidewall profiles is generated by a cutting or dicing process and deburring process, similar to that described in FIG. 2a. For example, a slanted or beveled sidewall profile is created in the upper part of the BSM and a vertical or substantially vertical sidewall profile may be created in the lower part of the BSM. In one embodiment, the upper part of the first metal layer 120 includes beveled surfaces 125, and the lower part of the first metal layer 120 and the second metal layer 130 include vertical or substantially vertical sidewalls 127 and 135 respectively. The deburred (beveled or slanted) and vertical or substantially vertical surfaces of the BSM serve as the bottom portion 170 of the sidewall profiles.

Figure 2C:
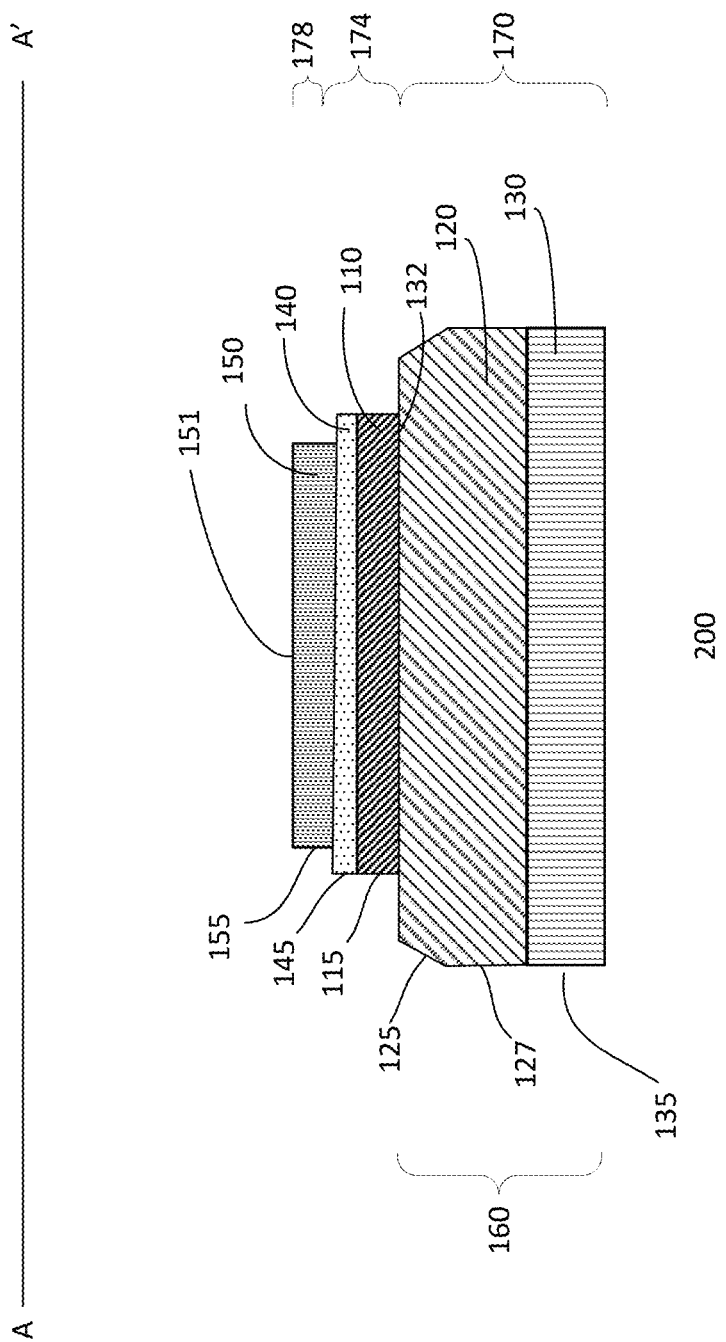

FIG. 2c shows sidewall profiles of yet another embodiment of a packaged die 200. The sidewall profiles include vertical and slanted portions. As shown, the sidewall profiles of the four sides of the die package are the same or about the same. Slight variations or differences may occur due to process variations. The sidewall profiles of the packaged die are similar to the sidewall profiles described in FIGS. 2a-2b. Common elements may not be described or described in detail.

As shown, a sidewall profile of a side of the package includes a top portion 178 with a vertical or substantially vertical sidewall, an intermediate portion 174 with a vertical or substantially vertical sidewall, and a bottom portion 170 having an upper bottom part with a slanted sidewall and a lower bottom part with a vertical or substantially vertical sidewall. In one embodiment, the slanted sidewalls are deburred surfaces while vertical or substantially vertical sidewalls are non-deburred surfaces. As shown, the top portion is recessed from the intermediate portion and the intermediate portion is recessed from the bottom portion.

In one embodiment, the top portion 178 of the sidewall profiles and the bottom portion 170 of the sidewall profiles are created similarly as described in FIGS. 2a-2b. For example, the vertical or substantially vertical sidewalls 155 of the second passivation layer 150 may serve as the top portion 178 of the sidewall profiles and the slanted surface 125 of upper part of the BSM and the vertical or substantially vertical surfaces 127 and 135 of the lower part of the BSM serve as the bottom portion of the sidewall profiles.

As for the intermediate portion 174, it is created by a grooving process. In one embodiment, the grooving process is a chemical etching process, such as RIE. The RIE patterns the first passivation layer and wafer (including the BEOL dielectric). The grooving process forms vertical or substantially vertical sidewalls for the first passivation layer 140 and wafer 110. The vertical or substantially vertical sidewalls of the first passivation layer 140 and wafer 110 are vertically aligned, creating a vertical or substantially vertical profile for the intermediate portion 174. The sidewall profile of the top portion is recessed from the sidewall profile of the intermediate portion.

Figure 2D:
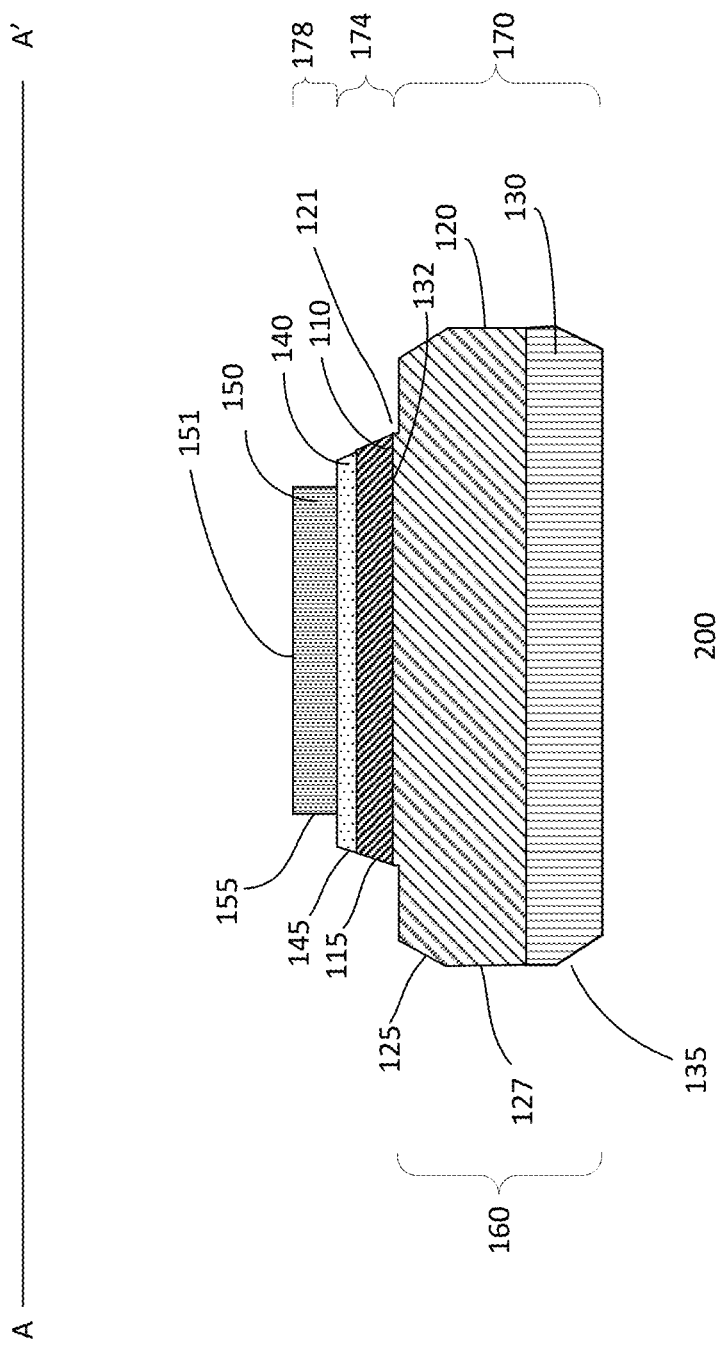

Referring to FIG. 2d, another embodiment of a packaged die 200 is shown. The sidewall profiles include vertical and slanted portions. As shown, the sidewall profiles of the four sides of the die package are the same or about the same. Slight variations or differences may occur due to process variations. The sidewall profiles of the packaged die are similar to the sidewall profiles described in FIGS. 2a-2c. Common elements may not be described or described in detail.

As shown, a sidewall profile of a side of the package includes a top portion 178 with a vertical or substantially vertical sidewall, an intermediate portion 174 with a slanted sidewall, and a bottom portion 170 having an upper bottom part with a slanted sidewall, an intermediate bottom part with a vertical or substantially vertical sidewall and a lower bottom part with a slanted sidewall. In one embodiment, the slanted sidewall 125 of the upper bottom part slants outwardly and the slanted sidewall 135 of the lower bottom part slants inwardly. In one embodiment, the slanted sidewalls 125 and 135 are deburred surfaces while vertical or substantially vertical sidewalls 127 are non-deburred surfaces. As shown, the top portion is recessed from the intermediate portion and the intermediate portion is recessed from the bottom portion.

In one embodiment, the upper and intermediate portions 178 and 174 of the sidewall profiles are created similarly as described in FIG. 2a. For example, the vertical or substantially vertical sidewalls 155 of the second passivation layer 150 may serve as the top portion 178 of the sidewall profiles and the slanted sidewalls 145 of the first passivation layer 140 and wafer (including the BEOL dielectric) 110 serve as the intermediate portion 174 of the sidewall profiles.

The bottom portion 170 of the sidewall profiles is generated by a cutting or dicing process. The dicing process cuts the BSM 160 to singulate the die packages. In one embodiment, the dicing process is a laser etching process. The laser etches the BSM, in one embodiment, from the wafer backside, forming vertical or substantially vertical sidewalls for the BSM. The laser dicing process is narrower than the laser grooving process. This results in the sidewalls of the first passivation layer and wafer being recessed from the sidewalls of the BSM.

As described, the grooving process deposits metal debris at about the interface of the wafer 110 and first metal layer 120 of the BSM. In addition, the dicing process from the backside of the wafer causes metal debris to deposit at about the bottom of the BSM and a protective coating used to perform the laser dicing as well as at the interface of the BSM and the dicing tape used to perform the laser dicing.

In one embodiment, a deburring process is performed to remove the metal debris at the bottom of the BSM. For example, the deburring process may form slanted or deburred surfaces 135 at a bottom portion of the BSM, such as a lower portion of the second metal layer 130 of the BSM. In one embodiment, a deburring process is performed to remove the metal debris at the interface of the dicing tape and BSM. The deburring process forms slanted or deburred surfaces 125 at an upper portion of the BSM, such as an upper portion of the first metal layer of the BSM.

Figure 2E:
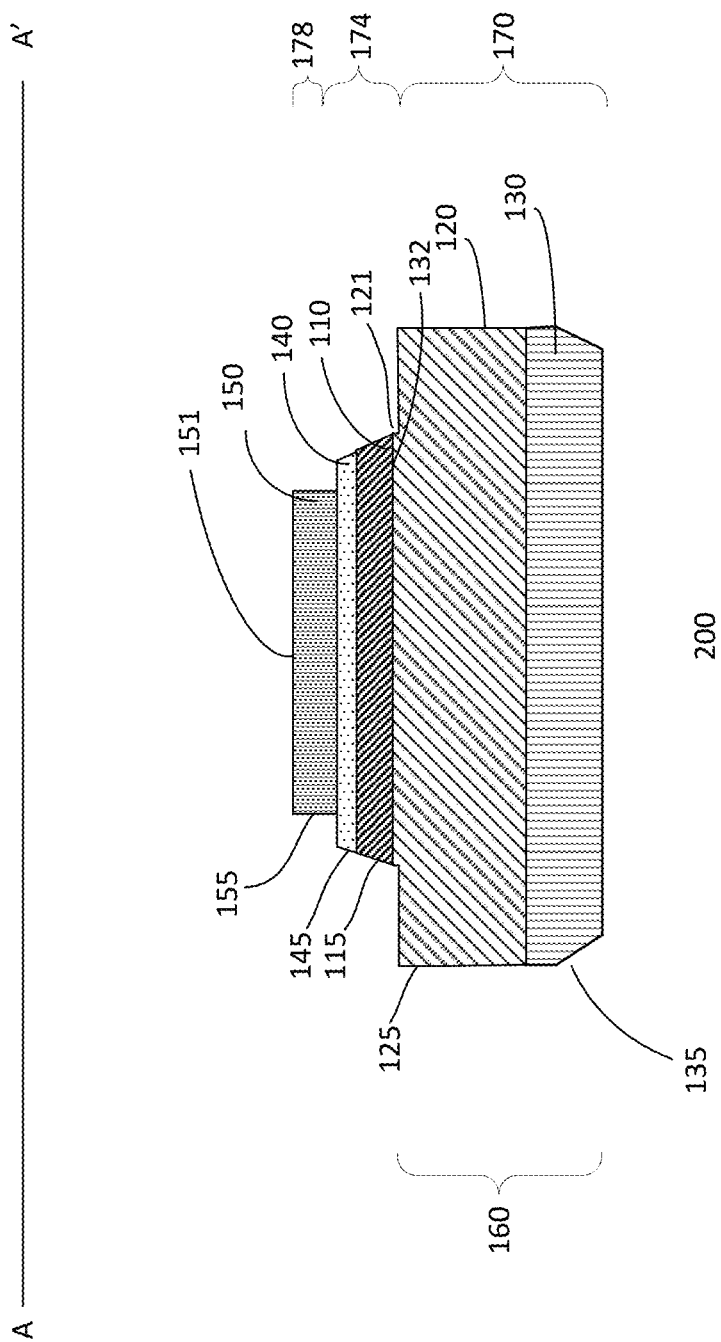

FIG. 2e shows another embodiment of a packaged die 200. The sidewall profiles include vertical and slanted portions. As shown, the sidewall profiles of the four sides of the die package are the same or about the same. Slight variations or differences may occur due to process variations. The sidewall profiles of the packaged die are similar to the sidewall profiles described in FIGS. 2a-2d. Common elements may not be described or described in detail.

As shown, a sidewall profile of a side of the package includes a top portion 178 with a vertical or substantially vertical sidewall 155, an intermediate portion 174 with a slanted sidewall 145 and 155, and a bottom portion 170 having an upper bottom part with a vertical or substantially vertical sidewall 125 and a lower bottom part with a slanted sidewall 135. In one embodiment, the slanted sidewall of the lower bottom part slants inwardly. In one embodiment, the slanted sidewalls are deburred surfaces while vertical or substantially vertical sidewalls are non-deburred surfaces. As shown, the top portion is recessed from the intermediate portion and the intermediate portion is recessed from the bottom portion.

In one embodiment, the top and intermediate portions 178 and 174 of the sidewall profiles are created similarly as described in FIG. 2a. For example, the vertical or substantially vertical sidewalls of the second passivation layer may serve as the top portion of the sidewall profiles and the slanted sidewalls 145 and 115 of the first passivation layer 140 and wafer (including the BEOL dielectric) 110 serve as the intermediate portion 174 of the sidewall profiles.

The bottom portion 170 of the sidewall profiles is generated by a cutting or dicing process. The dicing process cuts the BSM 160 to singulate the die packages. In one embodiment, the dicing process is a laser etching process. The laser etches the BSM, in one embodiment, from the wafer backside, forming vertical or substantially vertical sidewalls for the BSM. The laser dicing process is narrower than the laser grooving process. This results in the sidewalls of the first passivation layer and wafer being recessed from the sidewalls of the BSM.

As described, the grooving process deposits metal debris at about the interface of the wafer 110 and first metal layer 120 of the BSM. In addition, the dicing process from the backside of the wafer causes metal debris to deposit at about the bottom of the BSM and a protective coating used to perform the laser dicing as well as at the interface of the BSM and the dicing tape used to perform the laser dicing.

In one embodiment, a deburring process is performed to remove the metal debris at the bottom of the BSM. For example, the deburring process may form slanted or deburred surfaces 135 at a bottom portion of the BSM, such as a lower portion of the second metal layer 130 of the BSM. Metal debris may remain on the sidewall of the BSM. However, the metal debris remaining on the sidewall of the BSM may not impose any issue on the device as it is far from the wafer sidewall and active surface of the die.

As described, in the sidewall profiles of FIGS. 2a-2c, all cutting processes are performed from the frontside of the wafer. As for FIGS. 2d-2e, the dicing process for cutting the BSM is performed from the backside of the wafer. Other configurations of cutting processes as well as deburring processes may also be useful to produce a die package which is devoid of metal debris.

FIGS. 3a-3g show cross-sectional views along A-A' of an embodiment of a process for singulating semiconductor packages of a wafer with BSM 160. As shown is a portion of a wafer with a dicing street between portions of two packages along A-A'. It is understood that the wafer includes numerous packages separated by dicing streets in the x and y directions. The singulated semiconductor packages, for example, may be similar to the one illustrated in FIG. 2a. For example, the semiconductor packages may be rectangular-shaped packages, with the same or similar sidewall profiles on all sides. Common elements may not be described or described in detail.

Figure 3A:
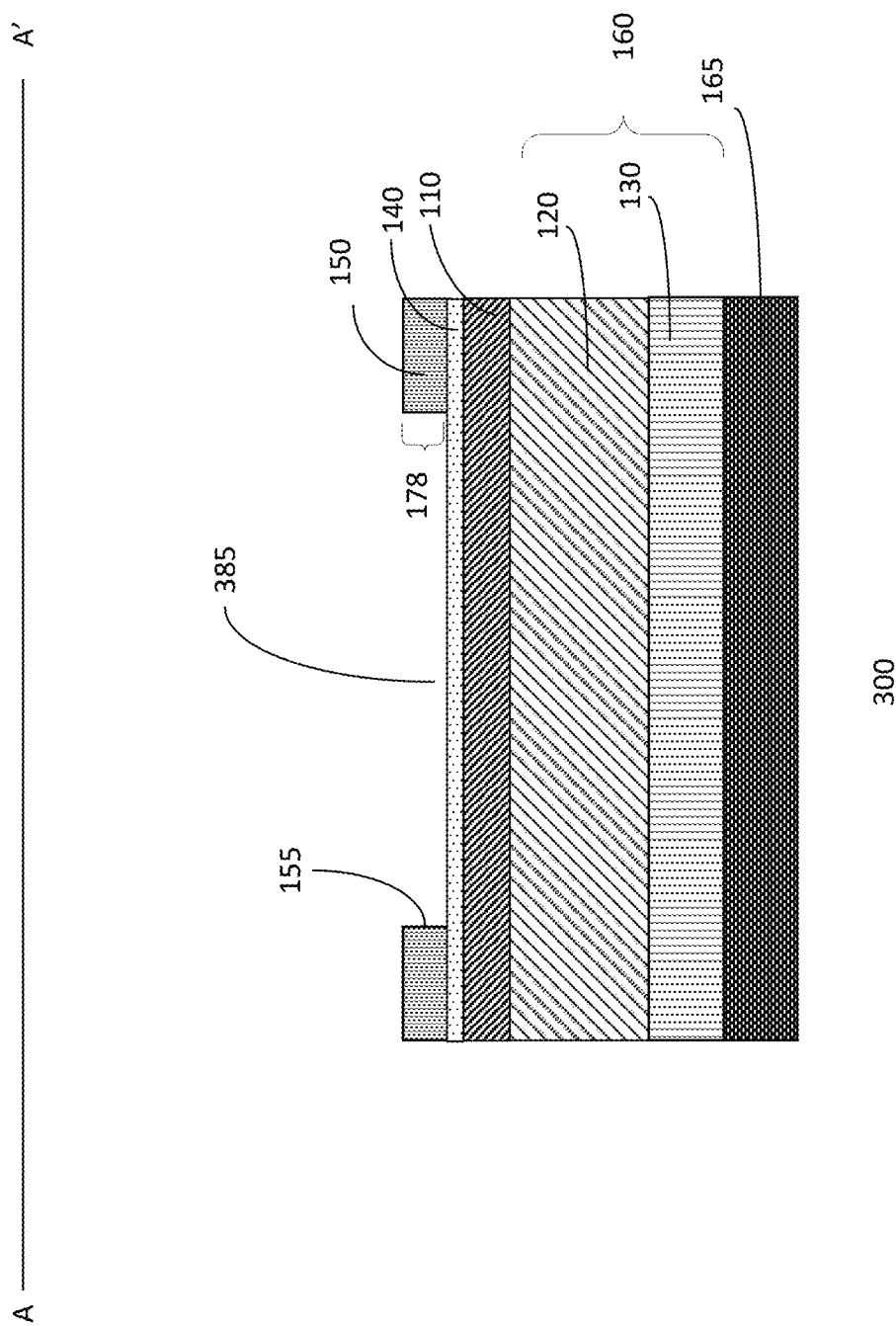
FIGS. 3a-3g show cross-sectional views of an embodiment of a process for forming a semiconductor package.

Referring to FIG. 3a, the process 300 begins by providing a prepared wafer 110. The prepared wafer includes a plurality of processed dies with circuit components on the top or active side of the wafer. A back-end-of-line (BEOL) dielectric with interconnects covers the active components.

A passivation stack may be provided over the BEOL dielectric. The passivation stack, for example, may include a combination of dielectric layers, such as silicon oxide and silicon nitride layers. Other types of dielectric layers may also be useful. As shown, the dielectric stack includes first and second passivation layers 140 and 150. The first passivation layer 140 may be the bottom passivation layer on the BEOL and the second passivation layer 150 may be the top passivation layer. The first passivation layer 140 may be 2 µm. The second passivation layer 150 may be 5 µm. Providing a passivation stack with other numbers of passivation layers may also be useful. The first passivation layer 140 may include a SiN layer, and the second passivation layer 150 may include a SiO$_2$ layer. Other types of material or configurations for the passivation stack may also be useful. Pad openings (not shown) are formed in the passivation stack to expose die contact pads on the top interconnect level for external die connections. The passivation stack, for example, may serve as a protective stack, protecting the die from moisture.

In one embodiment, the bottom or inactive surface of the wafer 110 includes BSM 160. The BSM may include a metal stack having a plurality of metal layers. The BSM may include, for example, gold, silver, chromium, titanium, tungsten, vanadium, nickel, other metals and alloys thereof. The BSM may be formed by chemical vapor deposition, sputter deposition, e-beam evaporation or plating. Other techniques may also be useful.

As shown, the BSM includes first and second metal layers 120 and 130. The first metal layer 120 is disposed on the inactive wafer surface 132 and the second metal layer 130 is disposed on the first metal layer 120. In one embodiment, the first metal layer is a silver layer while the second metal layer is a nickel layer. The thickness of the first metal layer may be about 50 µm while the second metal layer may be about 30 µm thick. Other numbers, types, thicknesses or configurations of metal layers may also be useful. The metal layers may be formed by sputtering or electroplating. Other techniques may also be used to form the BSM.

After formation of the interconnects and BSM, the semiconductor wafer 110 with the passivation layers and BSM may be attached to a dicing tape 165 with the BSM abut against the dicing tape. The dicing tape may be mounted on a dicing ring. In one embodiment, the wafer is singulated into individual die packages. As part of the singulation process, the wafer may be subjected to multiple cutting processes. The cutting processes may, for example, include laser etching, chemical etching using an etch mask, such as reactive ion etching using a patterned photoresist mask, or a combination thereof. Other types of cutting processes may also be useful.

In one embodiment, an open process is employed. In one embodiment, the open process patterns the second or top passivation layer 150. The open process forms openings or trenches 385 in the top passivation layer along the dicing streets of the wafer. The open process, for example, may be a chemical etch, such as RIE using a patterned resist mask as an etch mask (not shown). Portions of the top passivation layer exposed by the etch mask are removed. The etch selectively removes the top passivation layer and stops at the first or bottom passivation layer 140. For example, the first passivation layer may serve as an etch stop for the open process. The RIE is an anisotropic etch, forming a patterned top passivation layer with vertical or substantially vertical sidewalls 155. It is understood that process variations may cause slight variances from vertical. The vertical sidewalls or substantially vertical of the top passivation layer serve as the top portion 178 of the sidewall profiles of the singulated packages.

Figure 3B:
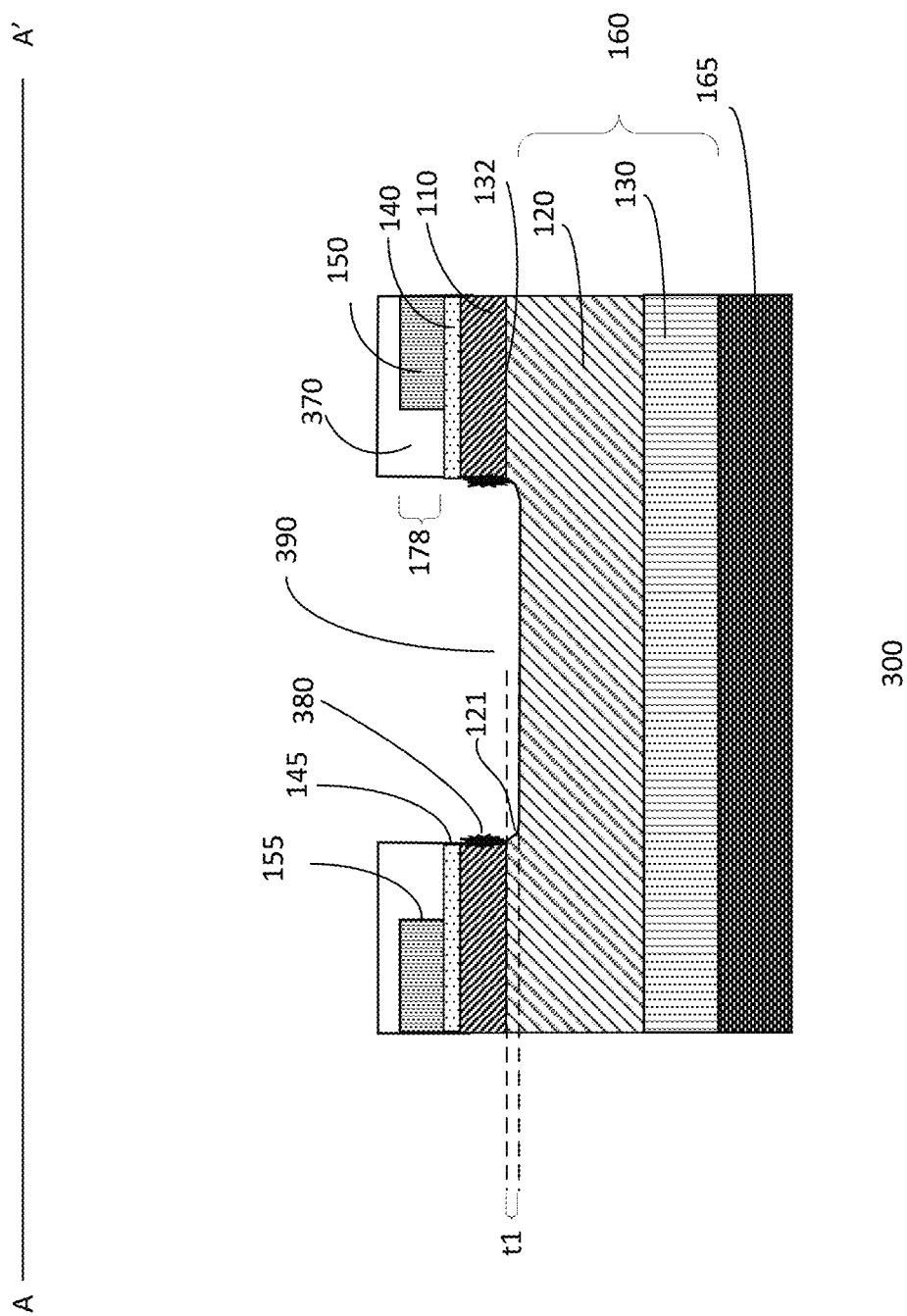

Referring to FIG. 3b, the singulation process continues with a grooving process. In one embodiment, a protective layer 370 is deposited on the wafer surface. The protective layer covers the passivation layer and fills the openings therein. The passivation layer, for example, may be a self-planarizing layer. This results in a planar surface over the wafer surface. The first protective layer 370 may be a water-soluble coating material easily removed by deionized water. For example, the protective layer may include a hydro-carbon based polymer. Other types of protective layers may also be useful. The first protective layer 370 may be formed by techniques such as spin on or spraying.

The grooving process, for example, may be a laser grooving process, such as laser etching. In one embodiment, the laser etches through the protective layer 370, the first passivation layer 140 and the wafer to form grooves or trenches 390 in the dicing lines of the wafer. For example, the sidewalls of the protective layer 370, sidewalls 145 of the first passivation layer 140 and sidewalls of the wafer 110 may be vertical or substantially vertical. In addition, a width of the groove 390 is less than the width of the trenches 385 of the second passivation layer 150 from the open process. This results in the top passivation layer being recessed from the sidewalls of the second passivation layer and the wafer.

In one embodiment, the laser process over etches the wafer 110, etching into the BSM. For example, the laser process may over etch the wafer by a depth of t1, t1, for example, may be about 3 µm to 5 µm. Other values for t1 may also be useful. The laser over etch forms a step 121 in the BSM below the wafer. The over etch causes metal debris 380 to be deposited on sidewalls of the wafer 110.

Figure 3C:
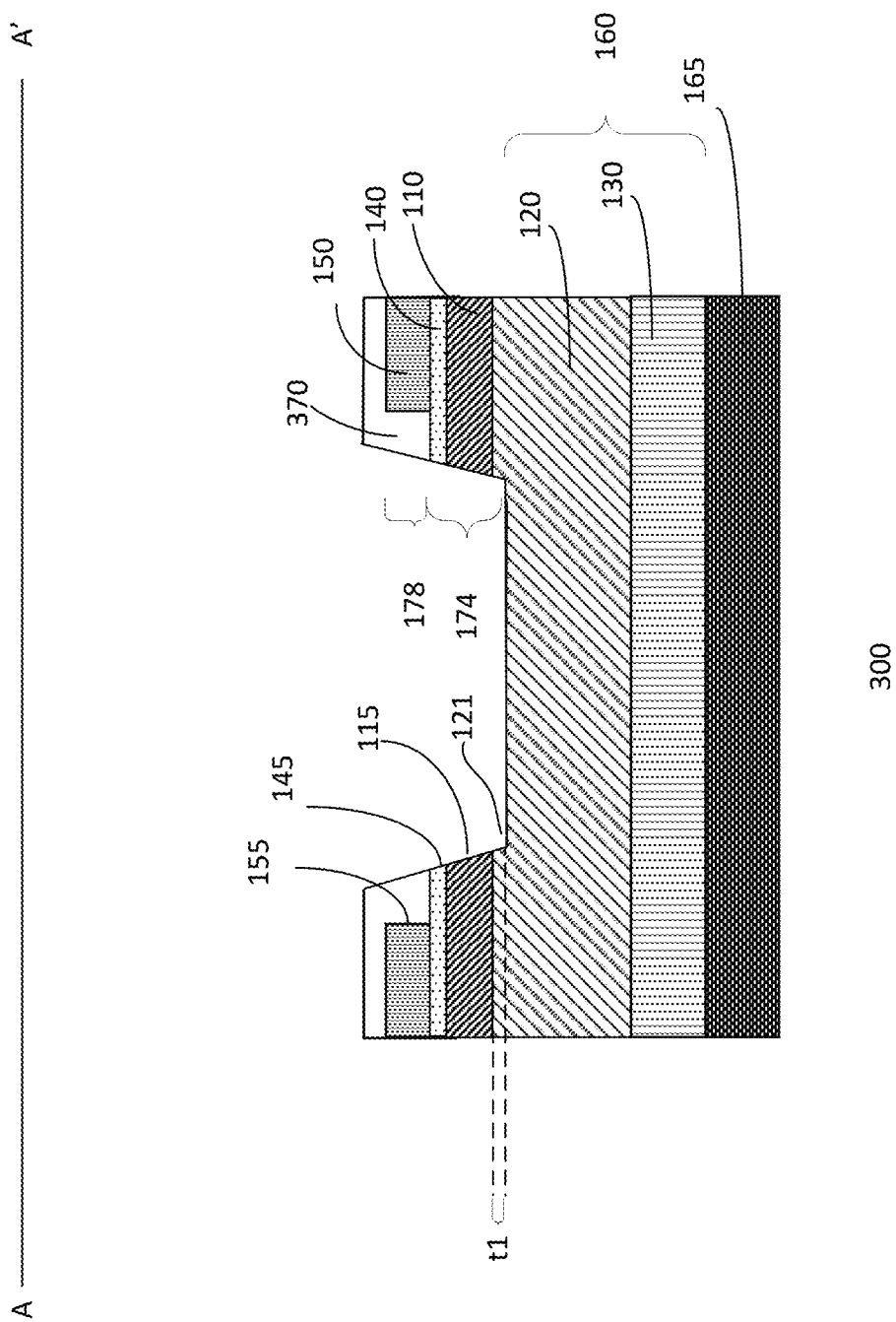

Referring to FIG. 3c, in one embodiment, a deburring process is performed to remove the metal debris 380. For example, a first deburring process may be performed to remove the metal debris. The first deburring process, in one embodiment, includes a laser deburring process. The deburring process may be achieved by beam splitting of a laser beam of a laser tool. The laser etching and deburring process may be carried out by the same laser tool. Other types of deburring processes may also be useful. The first deburring process forms deburred surfaces 115 and 145 on the exposed wafer and first passivation layer sidewalls as well as on the protective layer. The sidewall portion of the BSM surface at the step 121 may also be slanted due to the deburring process. For example, the sidewall portions of the over etched portion of the BSM may be deburred surfaces.

The deburred surfaces are beveled or slanted surfaces, creating a slanted or beveled sidewall profile for the wafer and first passivation sidewalls. The deburred surfaces of the first passivation layer, the wafer, and the over etched portion of the BSM serve as the intermediate portion 174 of the sidewall profiles of the singulated packages.

Figure 3D:
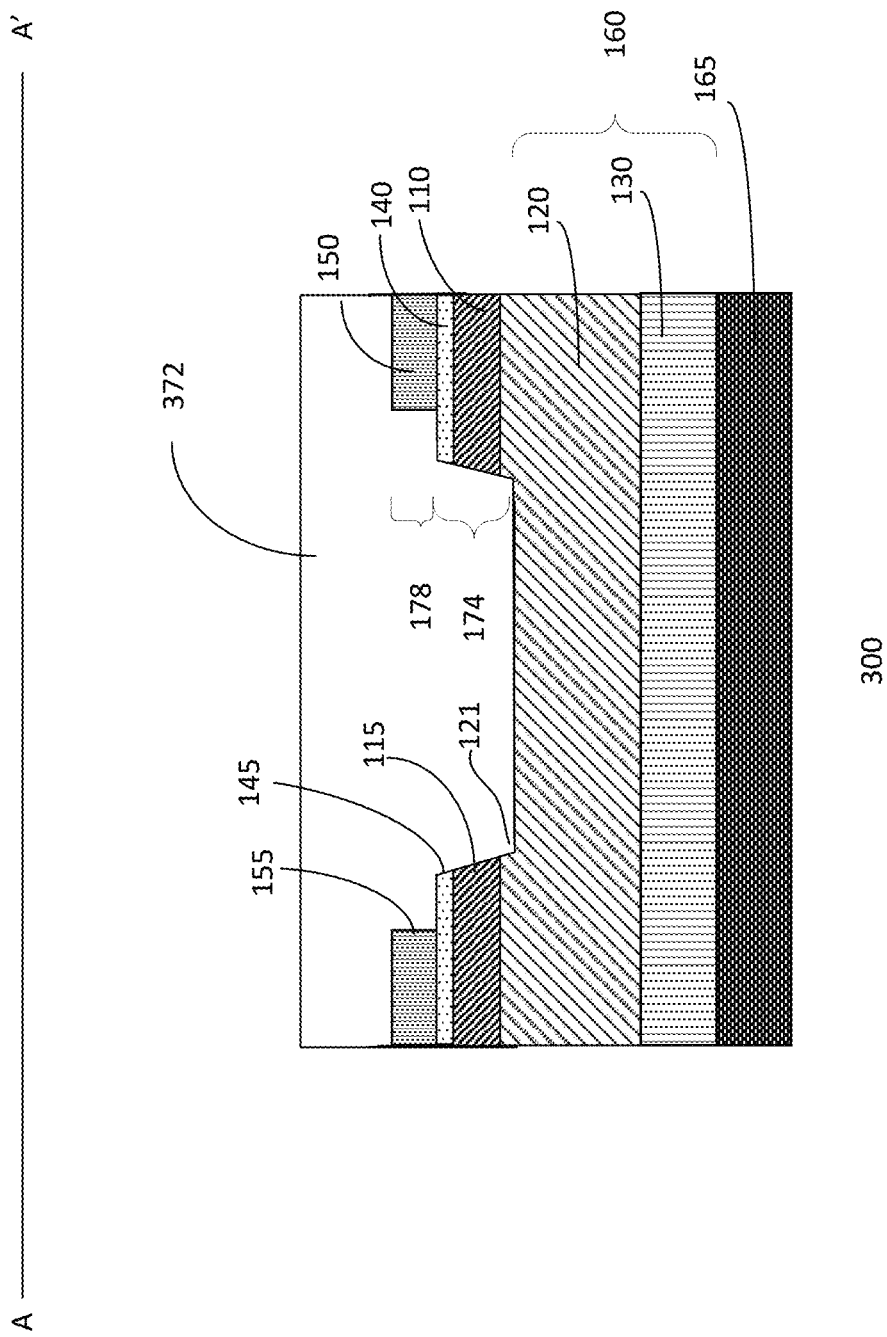

As shown in FIG. 3*d*, a protective layer 372 is formed over the wafer. For example, a second protective layer may be formed over the wafer. The second protective layer covers the wafer surface and fills the openings therein. The protective layer, for example, may be a self-planarizing layer. This results in a planar surface over the wafer surface. The second protective layer 372 may be similar or the same as the first protective layer. For example, the second protective layer may be a water-soluble coating material easily removed by deionized water. The second protective layer may include a hydro-carbon based polymer. Other types of protective layers may also be useful. The second protective layer may be formed by techniques such as spin on or spraying.

Figure 3E:
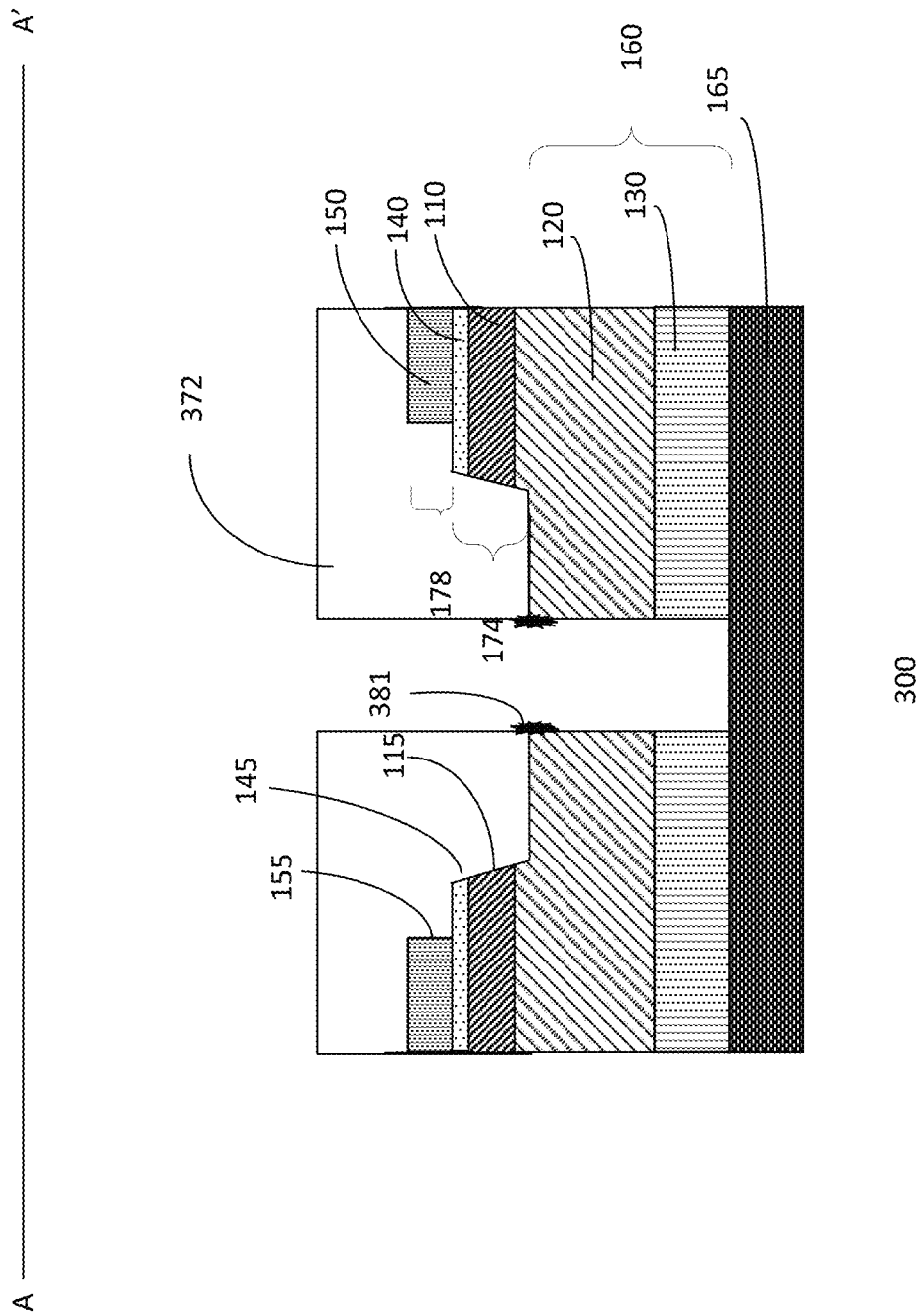

Referring to FIG. 3*e*, the wafer is cut or diced to singulate the die packages. For example, the BSM of the wafer may be cut or diced to singulate the die packages. In one embodiment, the dicing process is a laser etching process. The laser etches the second protective layer and BSM, forming vertical or substantially vertical sidewalls for the BSM. The laser dicing process is narrower than the laser grooving process. This results in the sidewalls of the first passivation layer and wafer being recessed from the sidewalls of the BSM.

The laser dicing process causes metal debris 381 to be deposited on sidewalls of the BSM near the interface of the BSM and second protective layer. For example, metal debris may be deposited on the upper portion of the BSM, such as on the upper portion of the first metal layer 120.

Figure 3F:
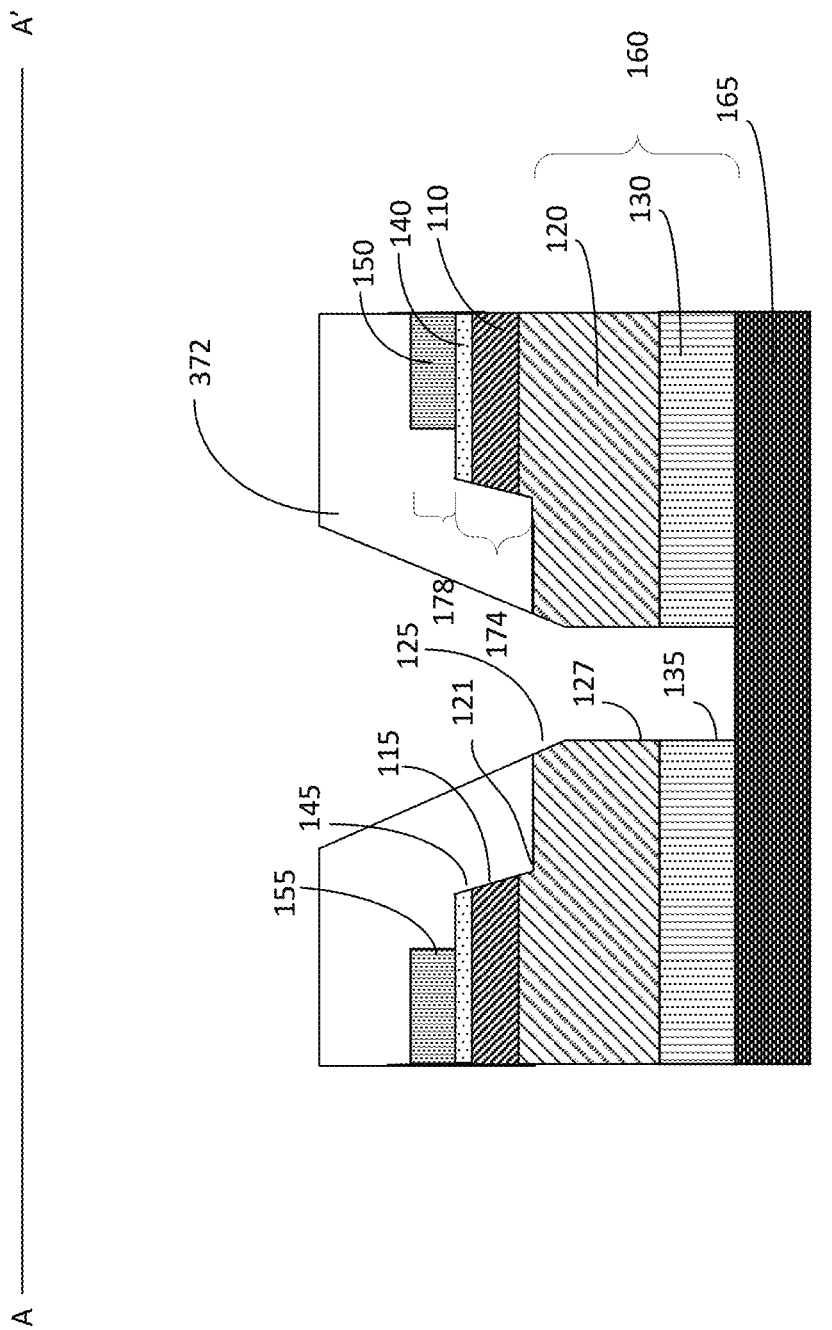

As shown in FIG. 3*f*, a deburring process is performed. For example, a second deburring process may be performed. The second deburring process may be similar or the same as the first deburring process. For example, the second deburring process may be a laser deburring process. Other types of deburring process may also be employed. The second deburring process forms deburred surfaces 125 on the sidewalls of the BSM. The deburred surfaces 125, for example, may be formed on the upper portion of the BSM, such as the upper portion of the first metal layer 120 of the BSM and the second protective layer. The deburred surfaces are beveled or slanted surfaces, creating a slanted or beveled sidewall profile in the upper part of the BSM and a vertical or substantially vertical sidewall profile for the lower part of the BSM. For example, the lower part of the first metal layer 120 and the second metal layer may include vertical or substantially vertical sidewalls 127 and 135. After the second deburring process, the protective layer may be removed, for example, by a clean process using deionized water. Other removal processes may also be useful. The deburred (beveled or slanted) and vertical or substantially vertical surfaces of the BSM serve as the bottom portion 170 of the sidewall profiles.

Figure 3G:
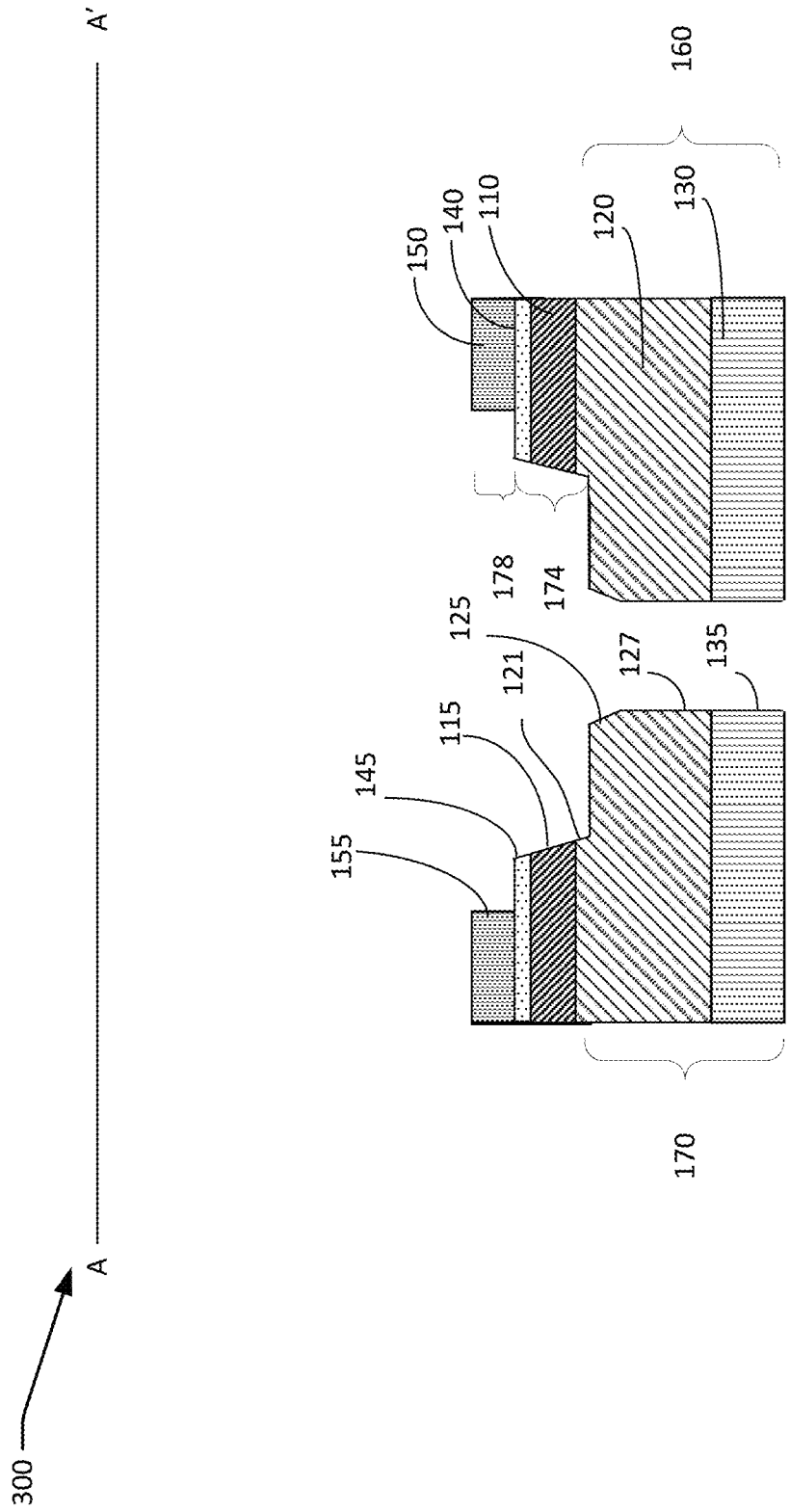

Referring to FIG. 3*g*, after dicing, the dicing tape is removed. This completes the singulation process of the die packages. As shown, the singulation process results in die packages without metal debris.

Figure 4A:
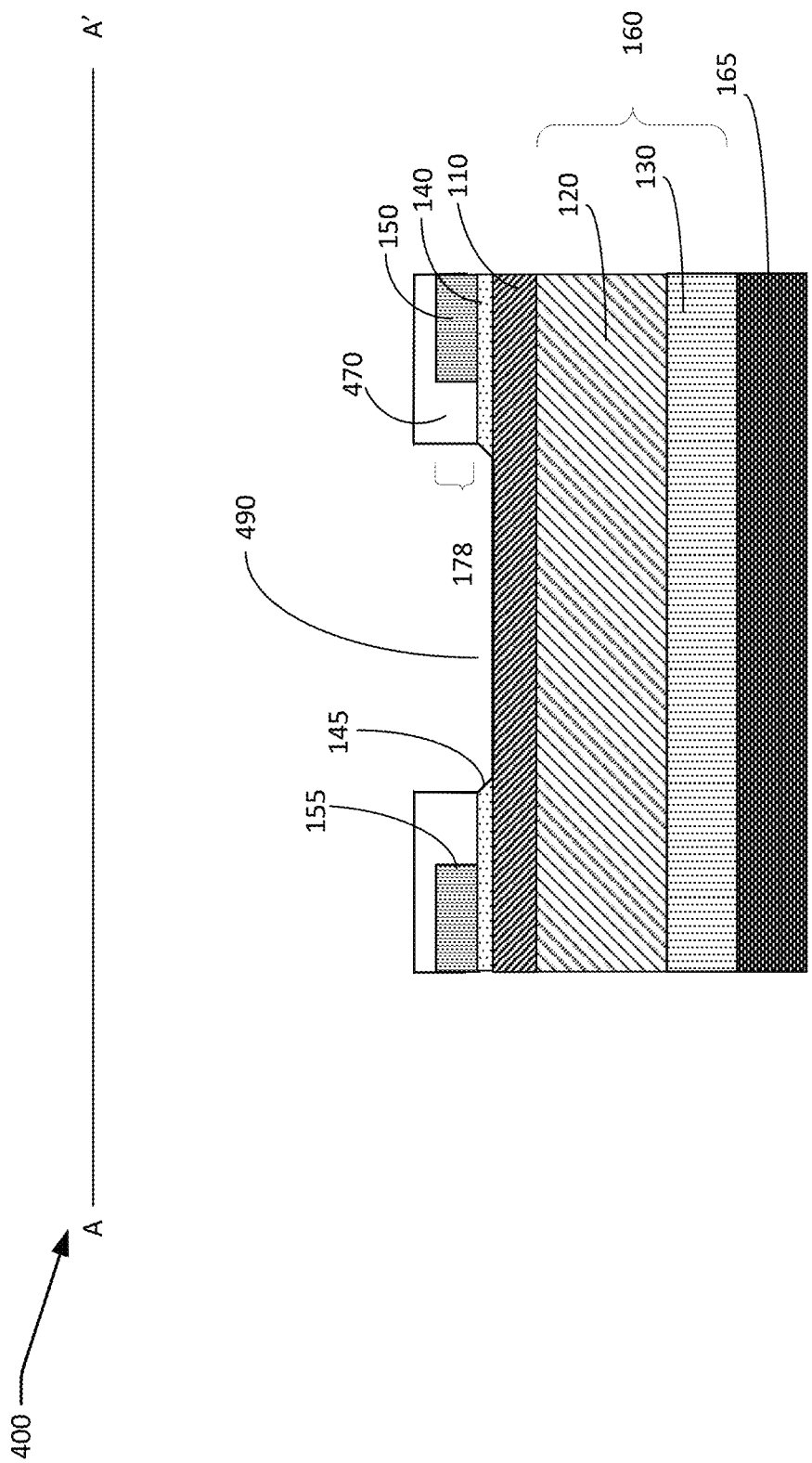
FIGS. 4a-4g show cross-sectional views of another embodiment of a process for forming a semiconductor package.

FIGS. 4*a*-4*g* show cross-sectional views of another embodiment of a process for singulating semiconductor packages of a wafer with BSM. The singulated semiconductor packages, for example, may be similar to the one illustrated in FIG. 2*b*. Common elements and features may not be described or described in detail. In the interest of brevity, the description of the process shown in FIGS. 4*a*-4*g* primarily focuses on the difference(s) compared with the process shown in FIGS. 3*a*-3*g*. Referring to FIG. 4*a*, the process 400 begins by providing a prepared wafer 110 including a plurality of processed dies, passivation layers and BSM similar to FIG. 3*a*.

The semiconductor wafer 110 with processed dies, passivation layers and BSM is singulated into individual die packages. As part of the singulation process, the wafer may be subjected to multiple cutting processes. The cutting processes may, for example, include laser etching, chemical etching using an etch mask, such as reactive ion etching using a patterned photoresist mask, or a combination thereof. Other types of cutting processes may also be useful.

In one embodiment, an open process similar to that described in FIG. 3*a* is employed. In one embodiment, the open process patterns the second passivation layer 150. The open process forms openings or trenches in the top passivation layer along the x and y dicing streets of the wafer. The open process, for example, may be a chemical etch, such as an RIE using a photoresist mask as an etch mask. The RIE patterns the second passivation layer 150 to form openings along the x and y dicing streets of the wafer. Portions of the top passivation layer exposed by the etch mask are removed. The etch selectively removes the top passivation layer and stops at the first or bottom passivation layer 140. For example, the first passivation layer may serve as an etch stop for the open process. The RIE is an anisotropic etch, forming a patterned top passivation layer with vertical or substantially vertical sidewalls 155. It is understood that process variations may cause slight variances from vertical. The vertical or substantially vertical sidewalls of the top passivation layer serve as the top portion 178 of the sidewall profiles of the singulated packages.

In one embodiment, as shown in FIG. 4*a*, the singulation process continues with a grooving process. In one embodiment, a first protective layer 470 is deposited on the wafer surface. The first protective layer covers the passivation layer and fills the openings therein. The first protective layer, for example, may be a self-planarizing layer. This results in a planar surface over the wafer surface. The first protective layer 470 may be a water-soluble coating material easily removed by deionized water. For example, the first protective layer may include a hydro-carbon based polymer. Other types of protective layers may also be useful. The first protective layer 470 may be formed by techniques such as spin on or spraying.

The grooving process, for example, may be a laser grooving process, such as laser etching. In one embodiment, the laser etches through the first protective layer 470 and the first passivation layer 140 to form grooves or trenches 490 in the dicing lines of the wafer and stops on the wafer 110. For example, the laser etch may form slanted sidewalls 145 of the first passivation layer 140. In addition, a width of the groove 490 is less than the width of the trenches of the second passivation layer 150 from the open process. This results in the top passivation layer being recessed from the sidewalls of the second passivation layer. The slanted sidewalls 145 of the first passivation layer 140 serves as the upper intermediate part of the intermediate portion 174 of the sidewall profiles.

Figure 4B:
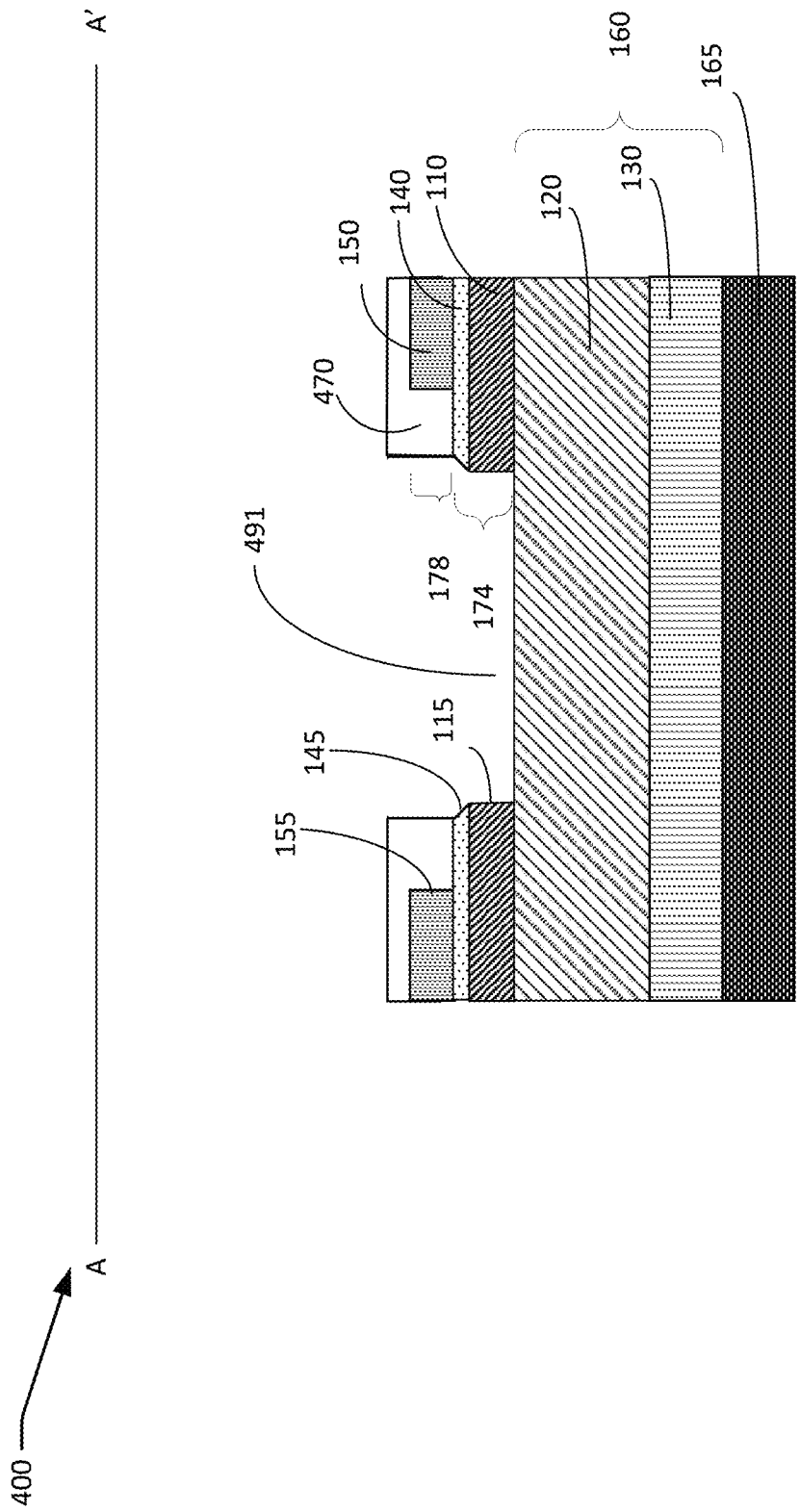

In one embodiment, as shown in FIG. 4*b*, the wafer 110 is etched to form grooves 491 along the x and y dicing streets within the grooves 490 of the first passivation layer 140. The etching process may include an RIE using the first protective layer over the first passivation layer as an etch mask. This results in the sidewalls of the second passivation layer being recessed from the sidewalls of the first passivation layer and wafer. The RIE stops on the BSM. For example, the first metal layer 120 may serve as an etch stop for the RIE. The RIE may form trenches with vertical or substantially vertical sidewalls 115 in the wafer 110. The vertical or substantially vertical sidewalls 115 of the wafer serve as the lower intermediate part of the intermediate portion 174 of the sidewall profiles. The use of RIE avoids metal debris deposited on the sidewalls of the wafer. As such, no deburring process is required.

Figure 4C:
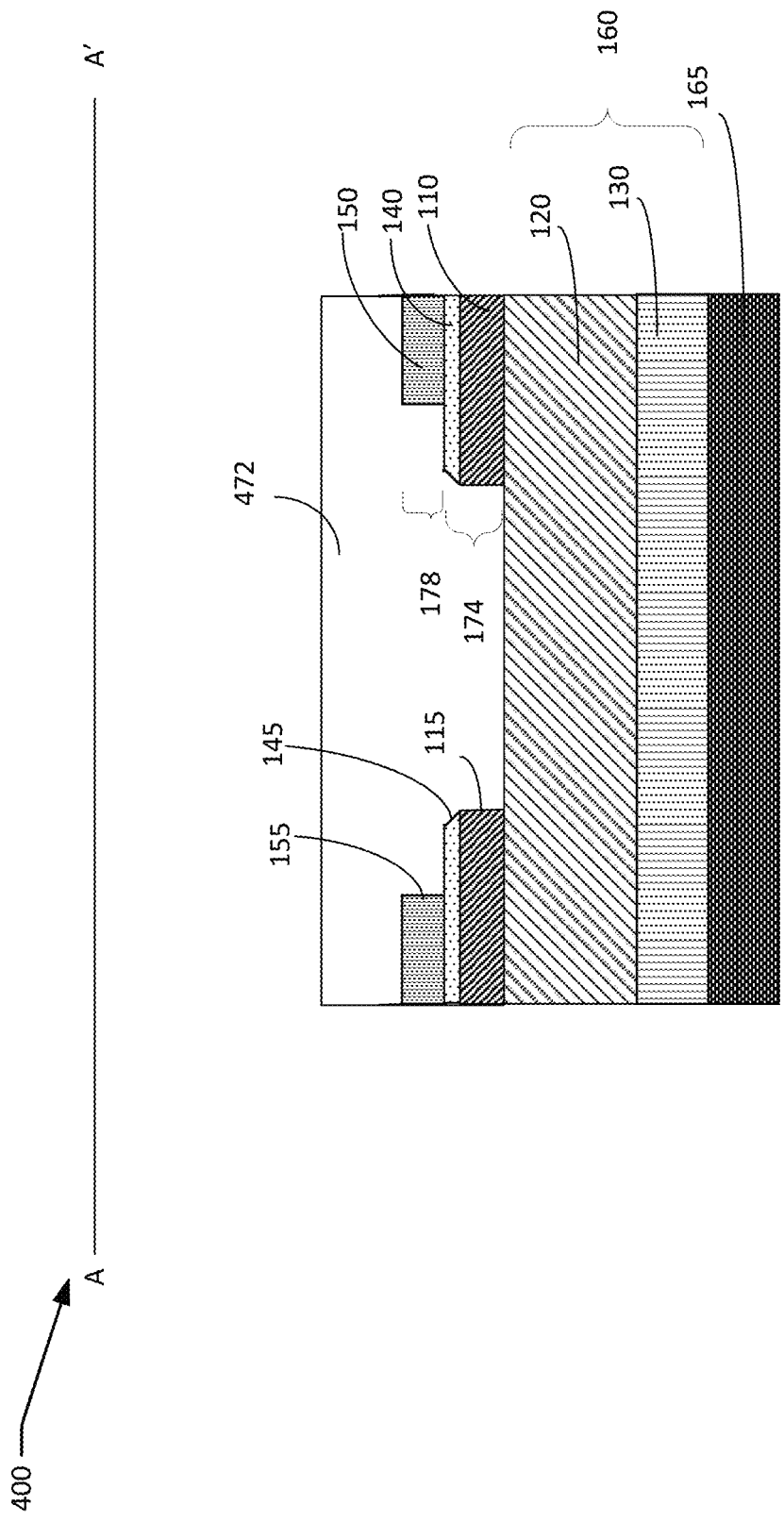

As shown in FIG. 4c, a protective layer 472 is formed over the wafer. For example, a second protective layer may be formed over the wafer. The second protective layer covers the wafer surface and fills the openings therein. The protective layer, for example, may be a self-planarizing layer. This results in a planar surface over the wafer surface. The second protective layer 472 may be similar or the same as the first protective layer. For example, the second protective layer may be a water-soluble coating material easily removed by deionized water. The second protective layer may include a hydro-carbon based polymer. Other types of protective layers may also be useful. The second protective layer may be formed by techniques such as spin on or spraying.

Figure 4D:
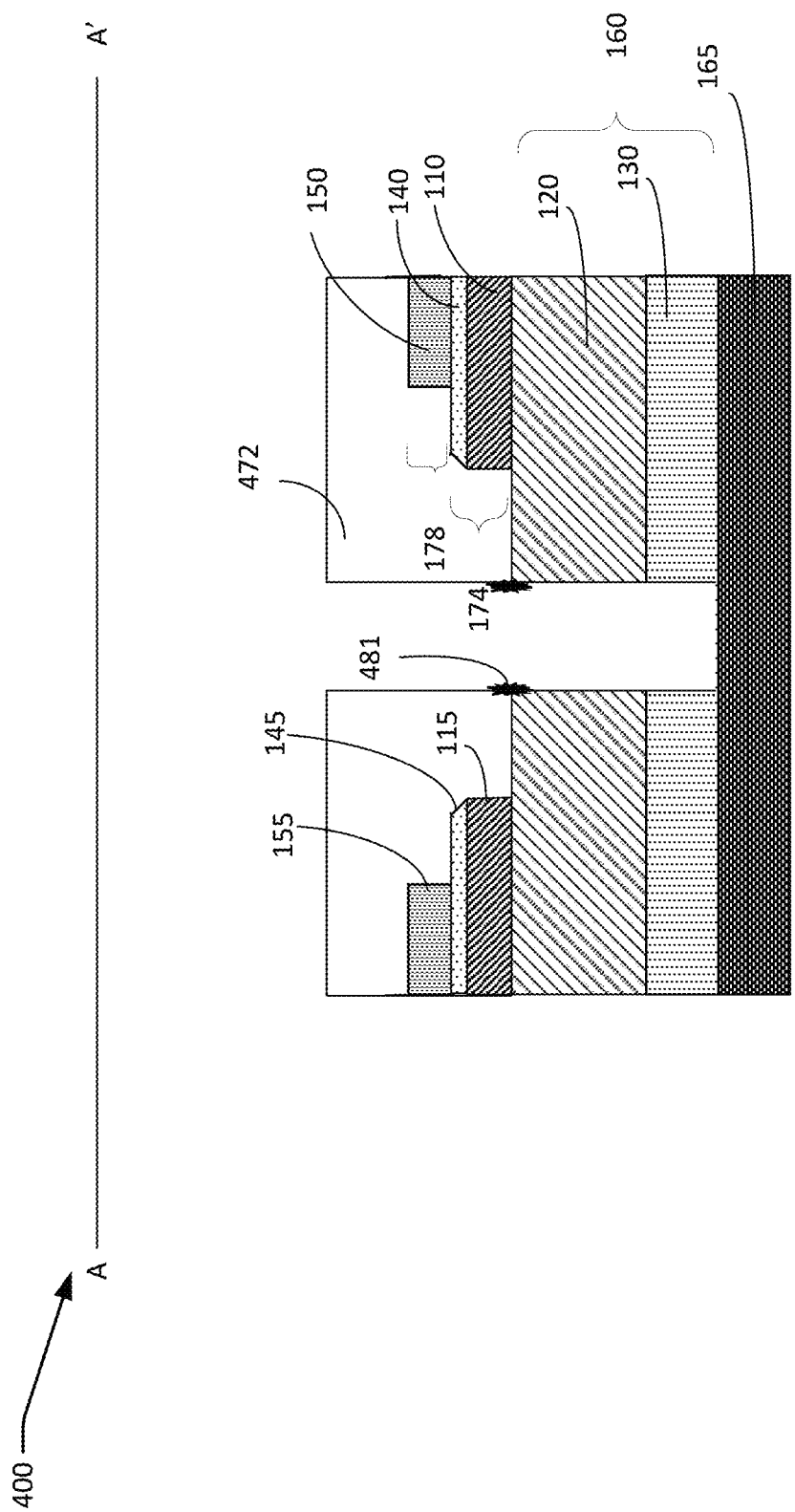

Referring to FIG. 4d, the wafer is cut or diced to singulate the die packages. For example, the BSM of the wafer may be cut or diced to singulate the die packages. In one embodiment, the dicing process is a laser etching process. The laser etches the second protective layer and BSM, forming vertical or substantially vertical sidewalls for the BSM. The laser dicing process is narrower than the laser grooving process. This results in the sidewalls of the first passivation layer and wafer being recessed from the sidewalls of the BSM.

The laser dicing process causes metal debris 481 to be deposited on sidewalls of the BSM near the interface of the BSM and second protective layer. For example, metal debris may be deposited on the upper portion of the BSM, such as on the upper portion of the first metal layer 120 and the second protective layer.

Figure 4E:
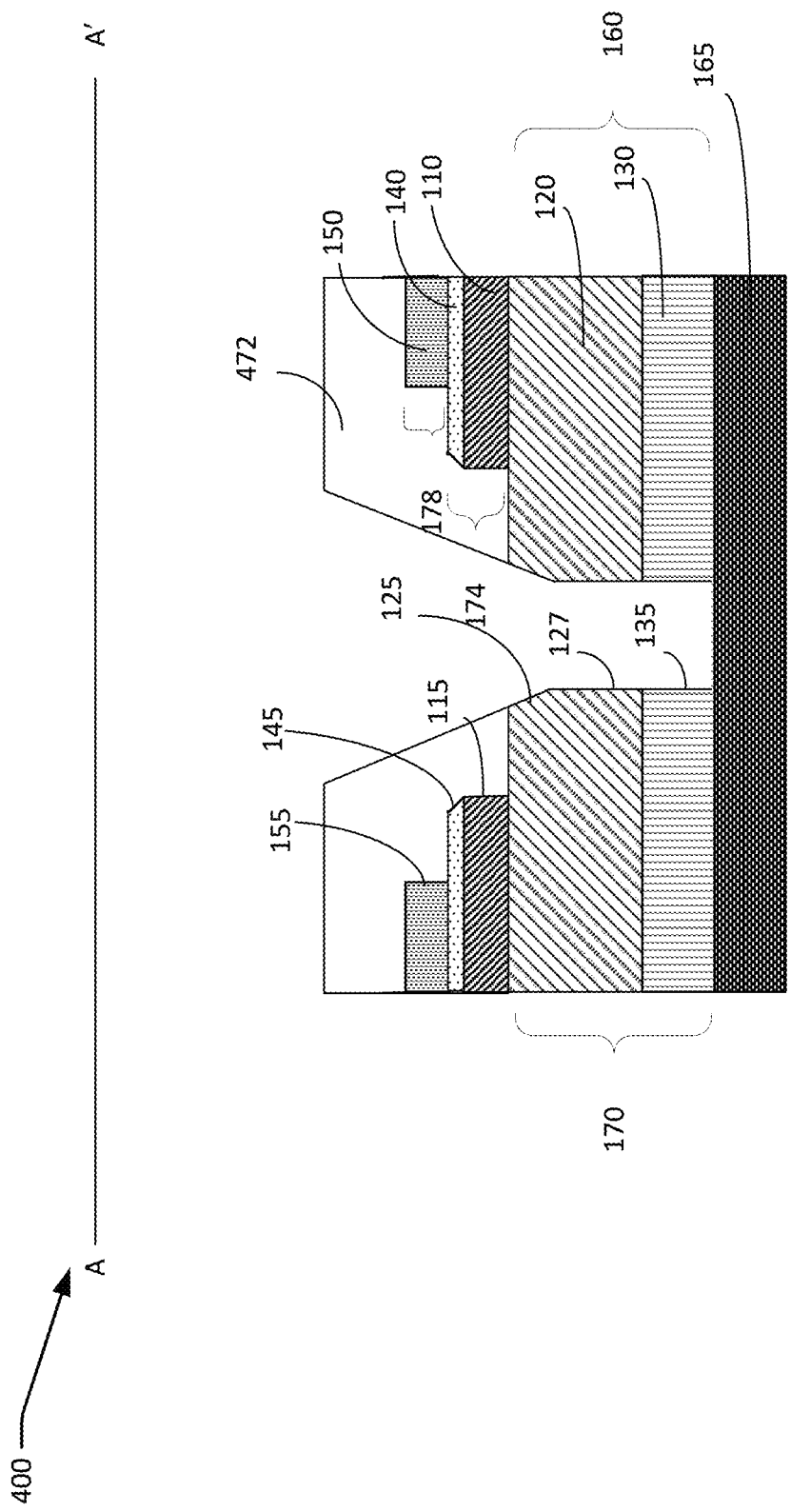

As shown in FIG. 4e, a deburring process is performed. For example, a second deburring process may be performed. The second deburring process may be similar or the same as the first deburring process. For example, the second deburring process may be a laser deburring process. Other types of deburring process may also be employed. The second deburring process forms deburred surfaces 125 on the sidewalls of the BSM. The deburred surfaces 125, for example, may be formed on the upper portion of the BSM, such as the upper portion of the first metal layer 120 of the BSM and the second protective layer. The deburred surfaces are beveled or slanted surfaces, creating a slanted or beveled sidewall profile in the upper part of the BSM and a vertical or substantially vertical sidewall profile for the lower part of the BSM. For example, the lower part of the first metal layer 120 and the second metal layer may include vertical or substantially vertical sidewalls 127 and 135.

Figure 4F:
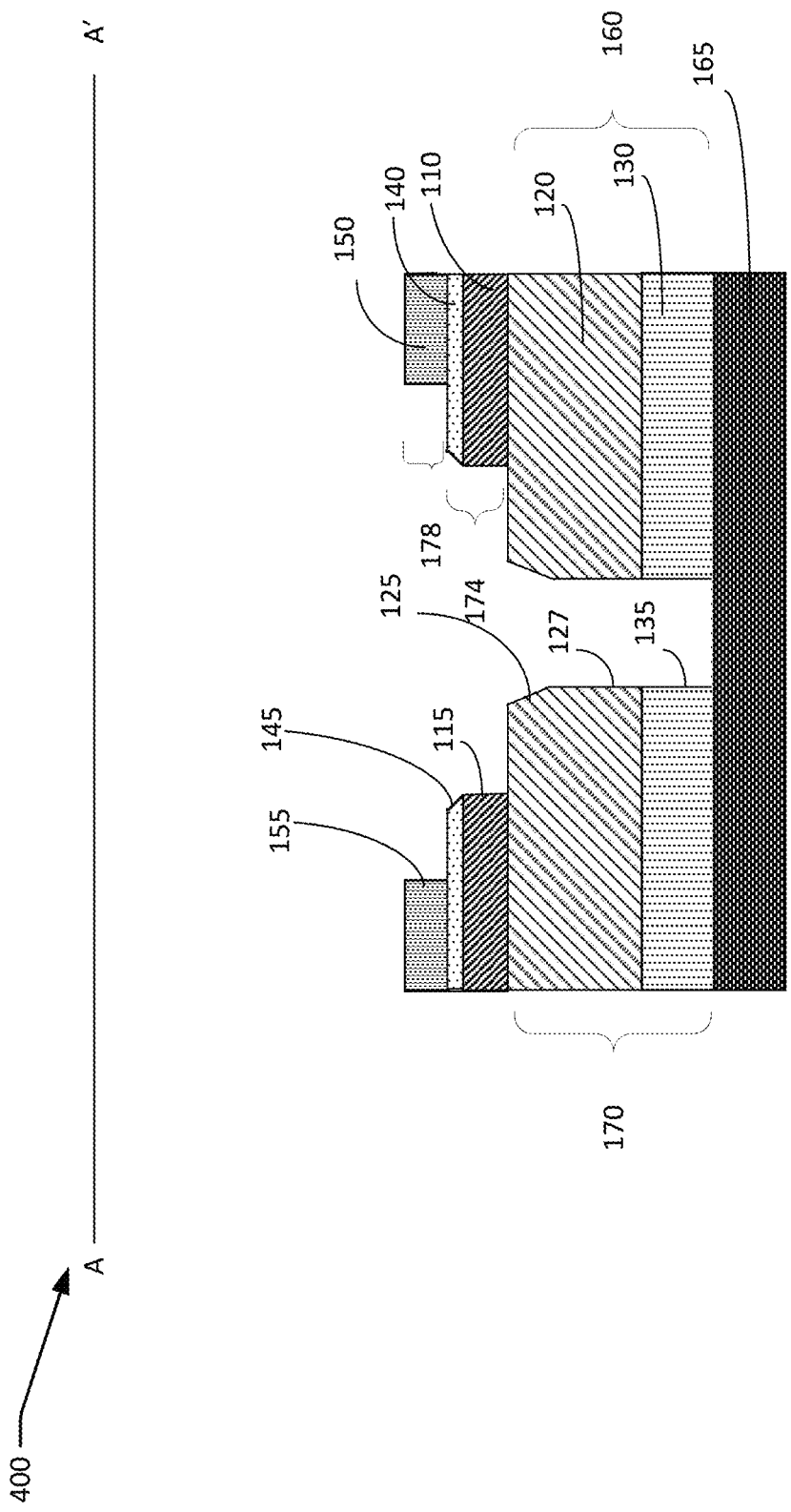

As shown in FIG. 4f, after the second deburring process, the second protective layer may be removed, for example, by a clean process using deionized water. Other removal processes may also be useful. The deburred (beveled or slanted) and vertical or substantially vertical surfaces of the BSM serve as the bottom portion 170 of the sidewall profiles.

Figure 4G:
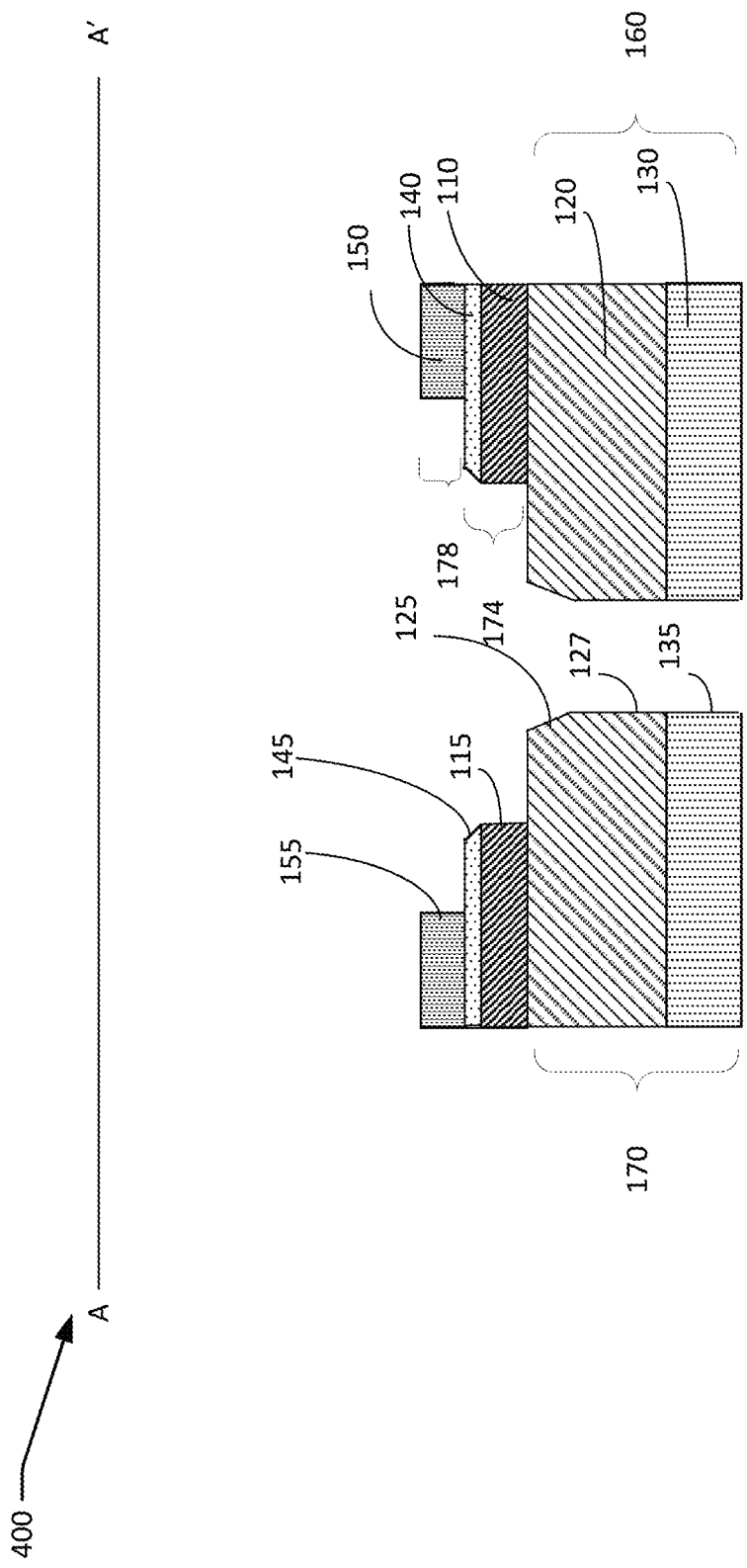

Referring to FIG. 4g, after dicing, the dicing tape is removed. This completes the singulation process of the die packages. As shown, the singulation process results in die packages without metal debris.

Figure 5A:
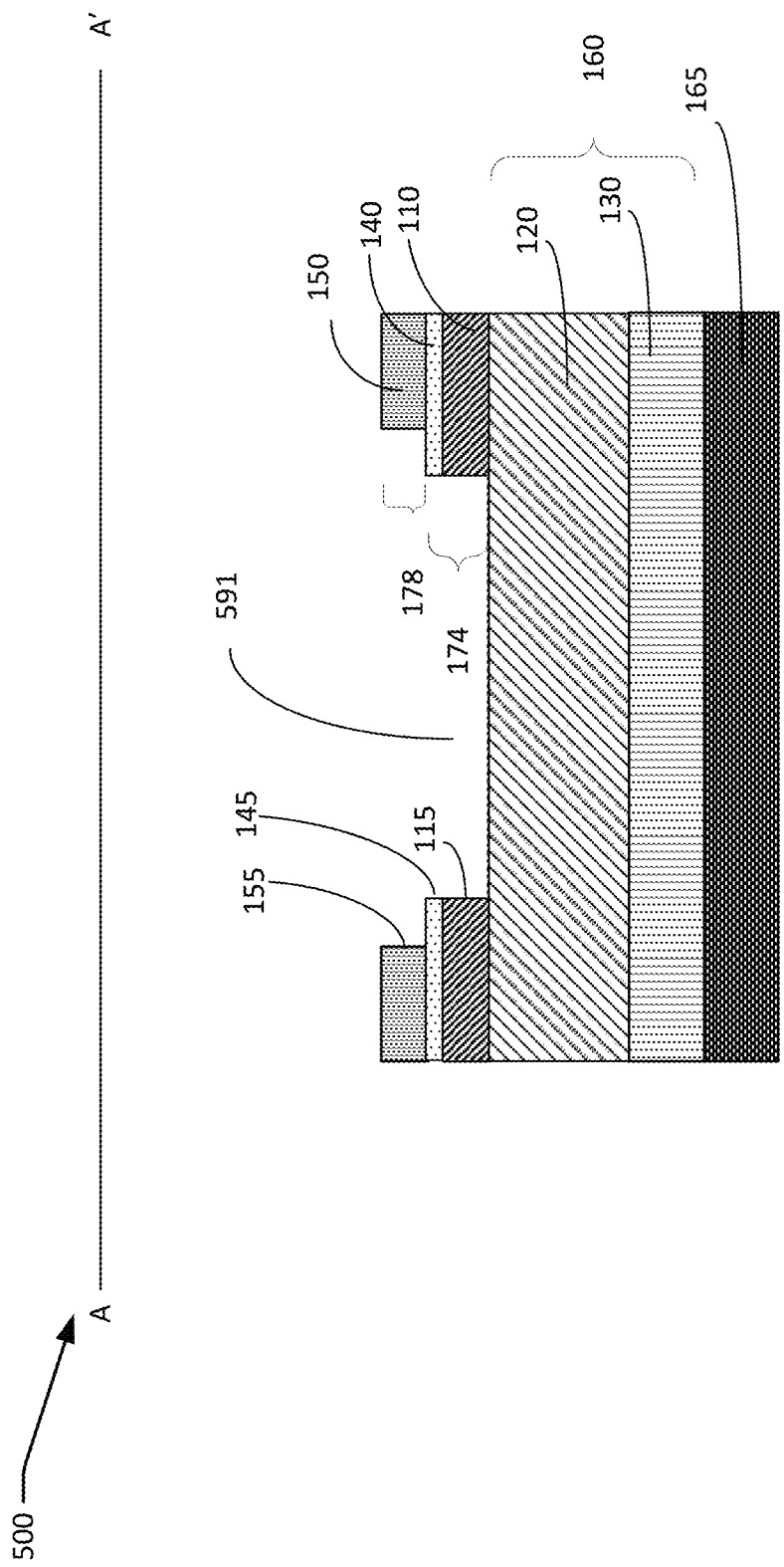
FIGS. 5a-5f show cross-sectional views of another embodiment of a process for forming a semiconductor package.
Figure 5B:
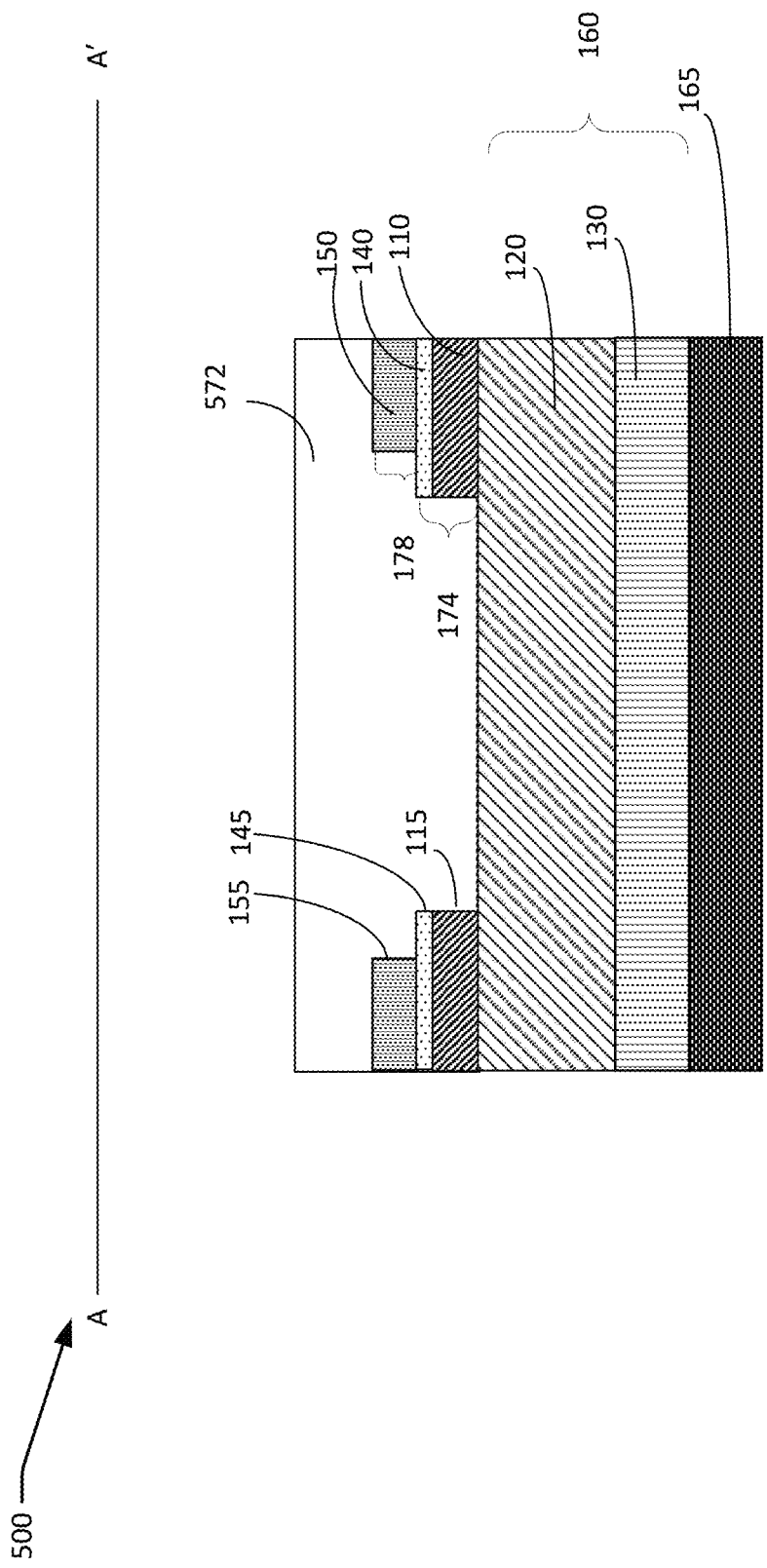
Figure 5C:
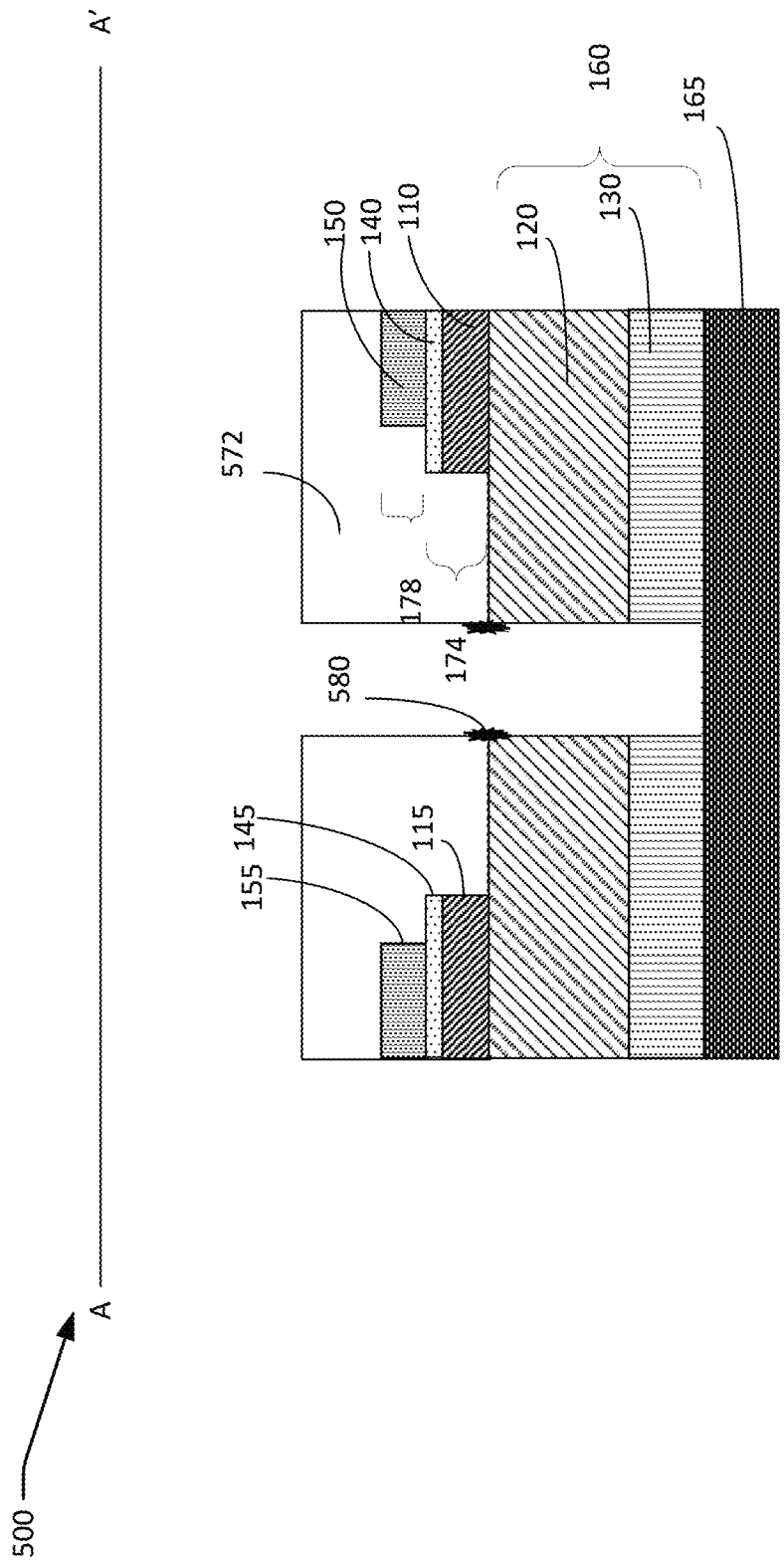
Figure 5D:
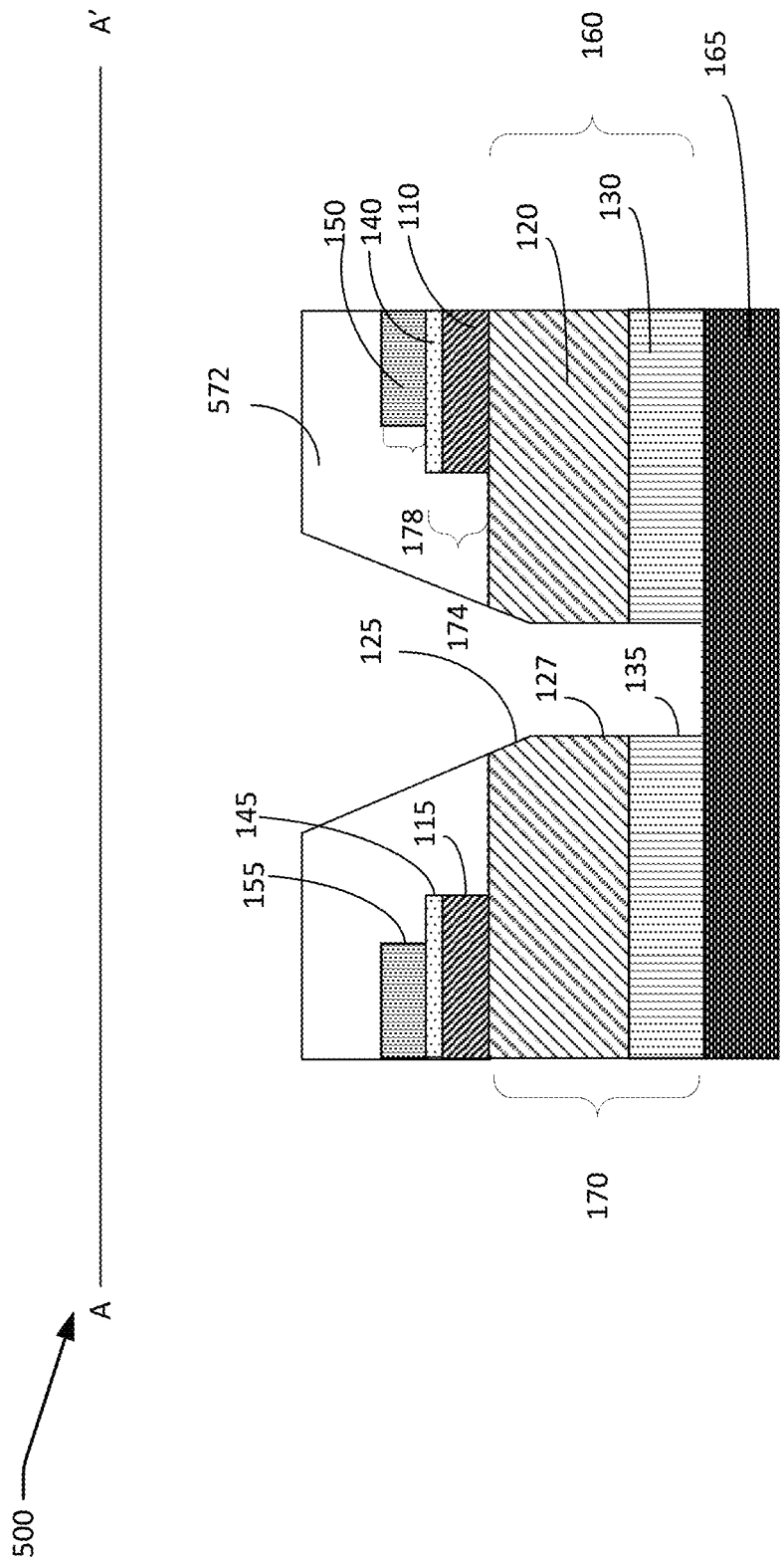
Figure 5E:
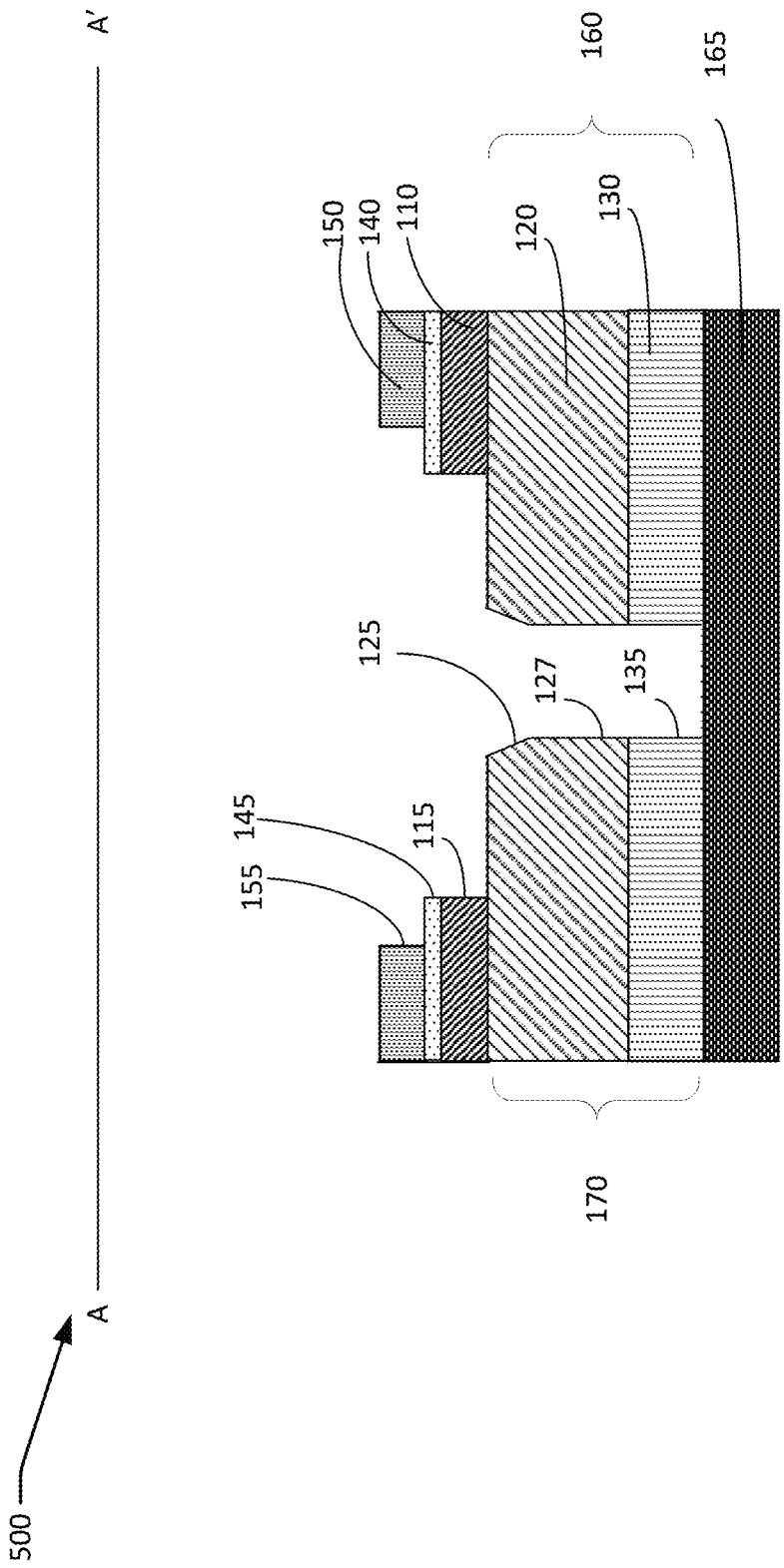

FIGS. 5a-5f show cross-sectional views of another embodiment of a process for singulating semiconductor packages of a wafer with BSM. The singulated semiconductor packages, for example, may be similar to the one illustrated in FIG. 2c. Common elements and features may not be described or described in detail. In the interest of brevity, the description of the process shown in FIGS. 5a-5f primarily focuses on the difference(s) compared with the process shown in FIGS. 3a-3g and 4a-4g. Referring to FIG. 5a, the process 500 begins by providing a prepared wafer 110 including a plurality of processed dies, passivation stacks and BSM similar to FIGS. 3a and 4a.

In one embodiment, the top portion 178 of the sidewall profiles is created similarly as described in FIGS. 3a and 4a. For example, the vertical or substantially vertical sidewalls 155 of the second passivation layer 150 formed by an open process. The open process, for example, may be a chemical etch, such as an RIE. The open process stops at the first passivation layer 140. The vertical or substantially vertical sidewalls 155 of the second passivation layer 150 may serve as the top portion 178 of the sidewall profiles.

In one embodiment, as shown in FIG. 5a, the second passivation layer 140 and wafer 110 are etched to form grooves 591 along the x and y dicing streets within the grooves of the second passivation layer 150. The etching process may include an RIE using a patterned resist mask as an etch mask (not shown) over the first passivation layer. This results in the sidewalls of the second passivation layer being recessed from the sidewalls of the first passivation layer and wafer. The RIE stops on the BSM. For example, the first metal layer 120 may serve as an etch stop for the RIE. The RIE may form trenches with vertical or substantially vertical sidewalls 145 in the first passivation layer 140 and vertical or substantially vertical sidewalls 115 in the wafer 110. The vertical or substantially vertical sidewalls 145 in the first passivation layer 140 and vertical or substantially vertical sidewalls 115 in the wafer 110 serve as the intermediate part of the intermediate portion 174 of the sidewall profiles. The use of RIE avoids metal debris deposited on the sidewalls of the wafer. As such, no deburring process is required.

Figure 5F:
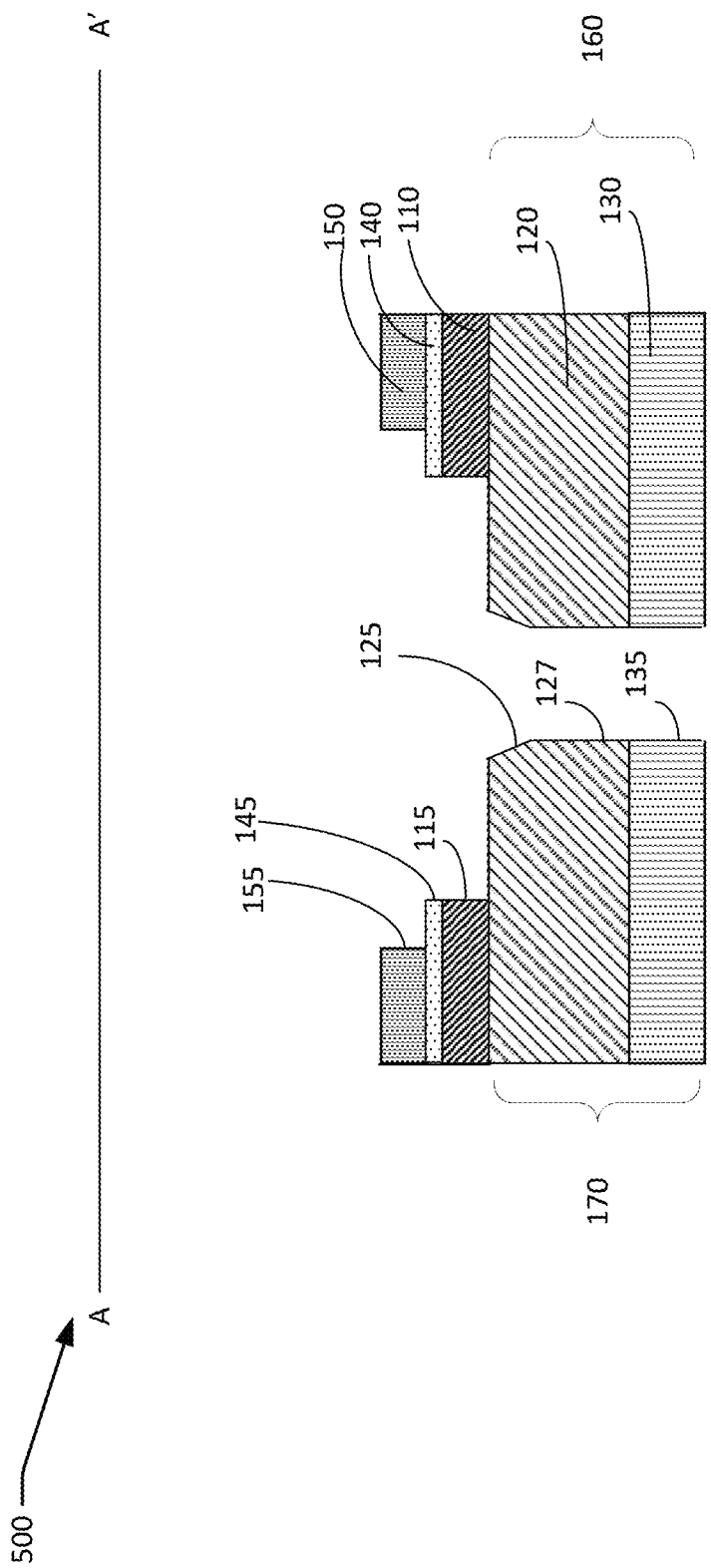

The process steps described in FIGS. 5b-5f are similar to those described in FIG. 4c-4g. In one embodiment, the process steps in FIGS. 5b-5e create a bottom portion 170 having an upper bottom part with a slanted sidewall and a lower bottom part with a vertical or substantially vertical sidewall. In one embodiment, the slanted sidewalls are deburred surfaces 125 of upper part of the BSM while vertical or substantially vertical sidewalls are non-deburred surfaces 127 and 135 of the lower part of the BSM. As shown, the sidewall profile of the intermediate portion 174 is recessed from the sidewall profile of the bottom portion 170. As shown in FIG. 5f, the dicing tape 165 may then be removed to obtain a plurality of the singulated packages similar to that shown in FIG. 2c.

Figure 6A:
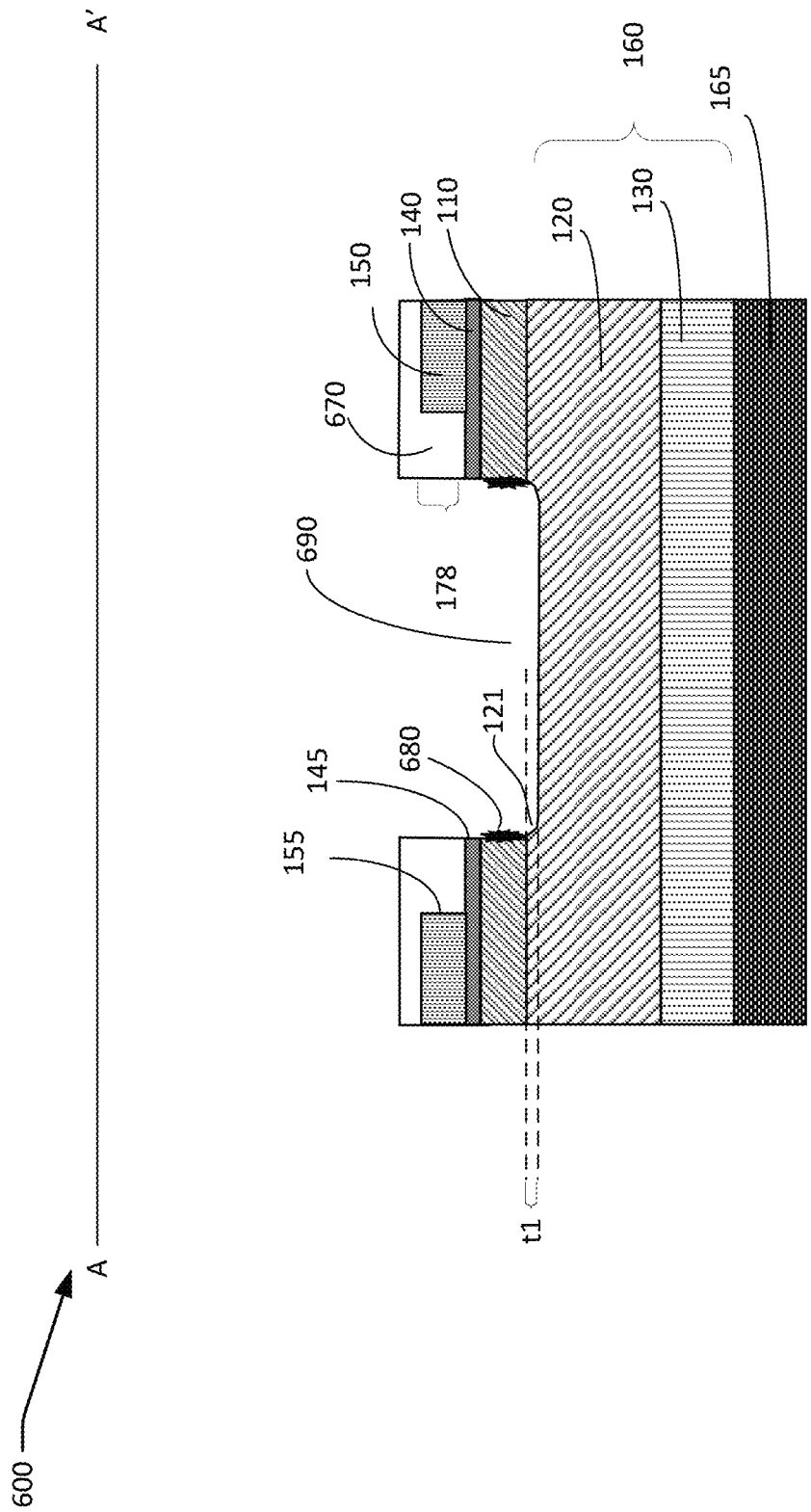

FIGS. 6a-6m show cross-sectional views of another embodiment of a process for singulating semiconductor packages of a wafer with BSM. The singulated semiconductor packages, for example, may be similar to the one illustrated in FIG. 2d. Common elements and features may not be described or described in detail. In the interest of brevity, the description of the process shown in FIGS. 6a-6m primarily focuses on the difference(s) compared with the process shown in FIGS. 3a-3g, 4a-4g and 5a-5f. Referring to FIG. 6a, the process 600 begins by providing a prepared wafer 110 including a plurality of processed dies, passivation stacks and BSM similar to FIGS. 3a, 4a and 5a.

Figure 6B:
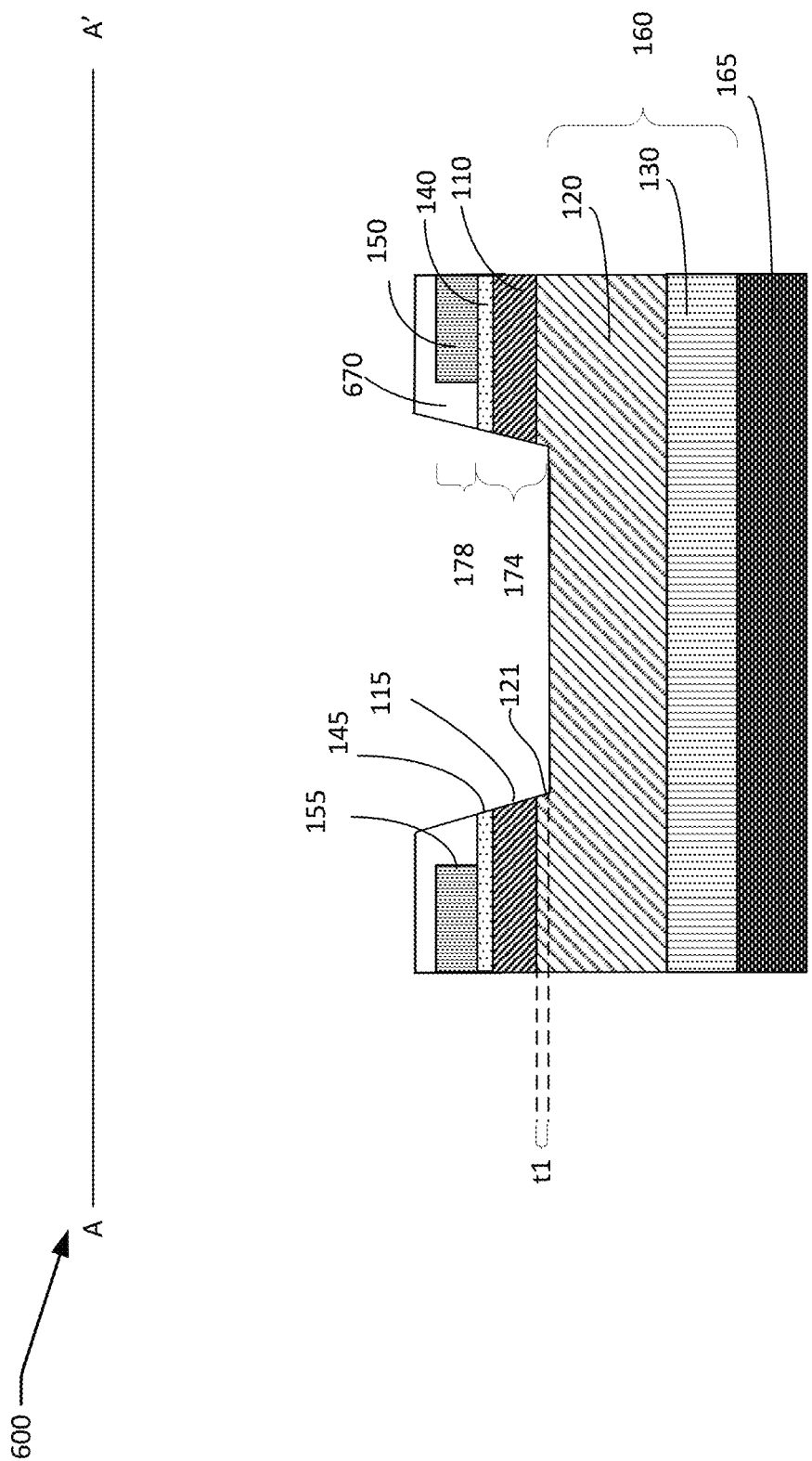

The process steps described in FIGS. 6a-b are similar to those described in FIGS. 3a-b. In one embodiment, an open process is employed. In one embodiment, the open process patterns the second or top passivation layer 150. The open process forms openings or trenches in the top passivation layer along the dicing streets of the wafer. The open process, for example, may be a chemical etch, such as RIE using a patterned resist mask as an etch mask (not shown). Portions of the top passivation layer exposed by the etch mask are removed. The etch selectively removes the top passivation layer and stops at the first or bottom passivation layer 140. For example, the first passivation layer may serve as an etch stop for the open process. The RIE is an anisotropic etch, forming a patterned top passivation layer with vertical or substantially vertical sidewalls 155. It is understood that process variations may cause slight variances from vertical. The vertical or substantially vertical sidewalls 155 of the top passivation layer serve as the top portion 178 of the sidewall profiles of the singulated packages.

Referring to FIG. 6a, the singulation process continues with a grooving process. In one embodiment, a protective layer 670 is deposited on the wafer surface. The protective layer covers the passivation layer and fills the openings therein. The passivation layer, for example, may be a self-planarizing layer. This results in a planar surface over the wafer surface. The first protective layer 670 may be a water-soluble coating material easily removed by deionized water. For example, the protective layer may include a hydro-carbon based polymer. Other types of protective layers may also be useful. The first protective layer 670 may be formed by techniques such as spin on or spraying.

The grooving process, for example, may be a laser grooving process, such as laser etching. In one embodiment, the laser etches through the protective layer 670, the first passivation layer 140 and the wafer to form grooves or trenches 690 in the dicing lines of the wafer. For example, the sidewalls of the protective layer 670, sidewalls 145 of the first passivation layer 140 and sidewalls of the wafer 110 may be vertical or substantially vertical. In addition, a width of the groove 690 is less than the width of the trenches of the second passivation layer 150 from the open process. This results in the top passivation layer being recessed from the sidewalls of the second passivation layer and the wafer.

In one embodiment, the laser process over etches the wafer 110, etching into the BSM. For example, the laser process may over etch the wafer by a depth of t1, t1, for example, may be from about 3 µm to about 5 µm. Other values for t1 may also be useful. The laser over etch forms a step 121 in the BSM below the wafer. The over etch causes metal debris 680 to be deposited on sidewalls of the wafer 110.

Referring to FIG. 6b, in one embodiment, a deburring process is performed to remove the metal debris 680. For example, a first deburring process may be performed to remove the metal debris. The first deburring process, in one embodiment, includes a laser deburring process. Other types of deburring processes may also be useful. The first deburring process forms deburred surfaces 115 and 145 on the exposed wafer and first passivation layer sidewalls as well as on the protective layer. The sidewall portion of the BSM surface at the step 121 may also be slanted due to the deburring process. For example, the sidewall portions of the over etched portion of the BSM may be deburred surfaces. After the deburring process, the protective layer 670 is removed. For example, the protective layer may be removed by a clean process. In one embodiment, the clean process includes rinsing the wafer with deionized water. Other techniques for removing the protective layer may also be useful.

The deburred surfaces are beveled or slanted surfaces, creating a slanted or beveled sidewall profile for the wafer and first passivation sidewalls. The deburred surfaces of the first passivation layer, the wafer, and the over etched portion of the BSM serve as the intermediate portion 174 of the sidewall profiles of the singulated packages.

Figure 6C:
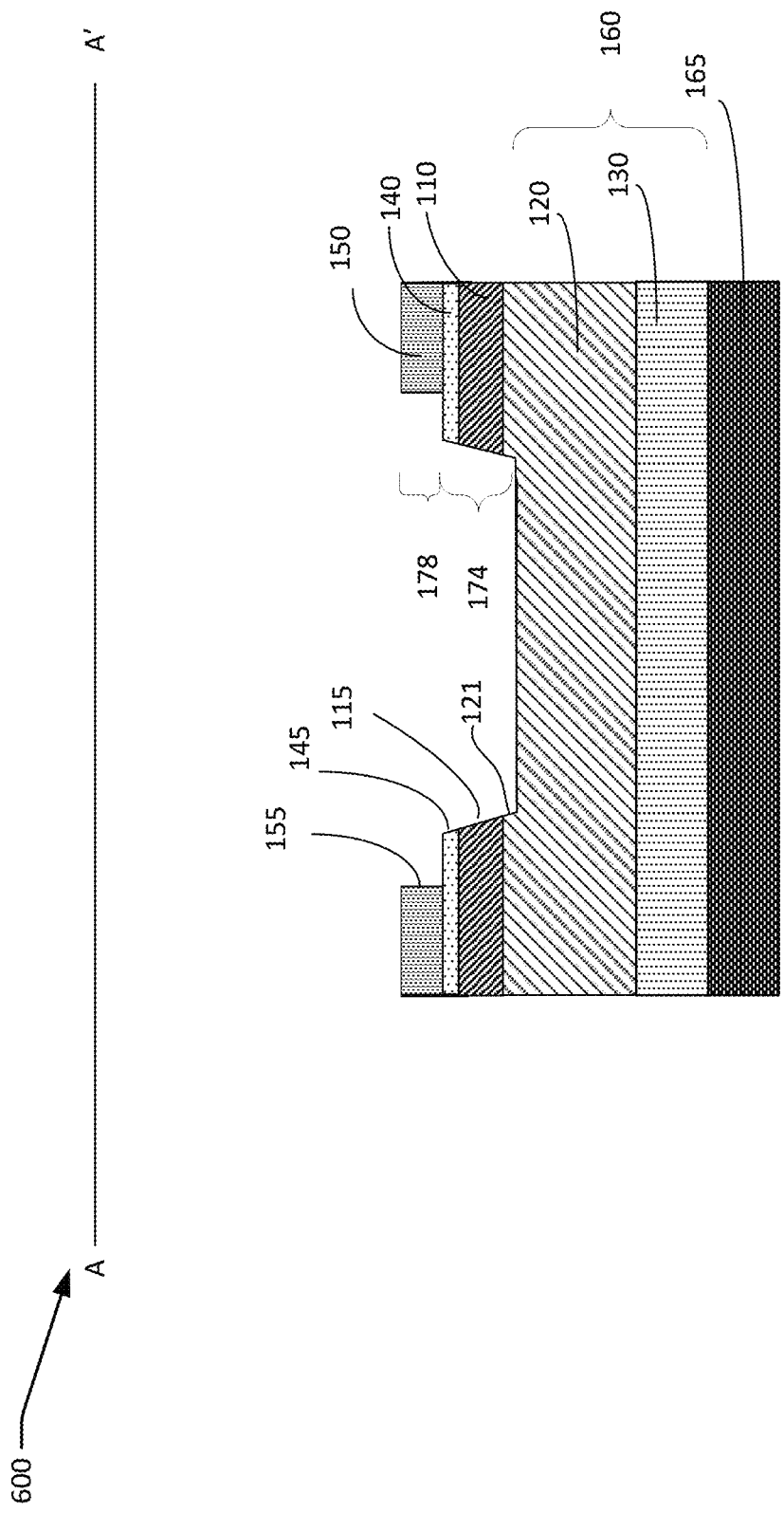

In one embodiment, the second protective layer 670 is removed as shown in FIG. 6c. In one embodiment, the removal is achieved by a cleaning process. For example, the protective layer may be removed by deionized water. The protective layer may also be removed by other methods or cleaning agents.

Figure 6D:
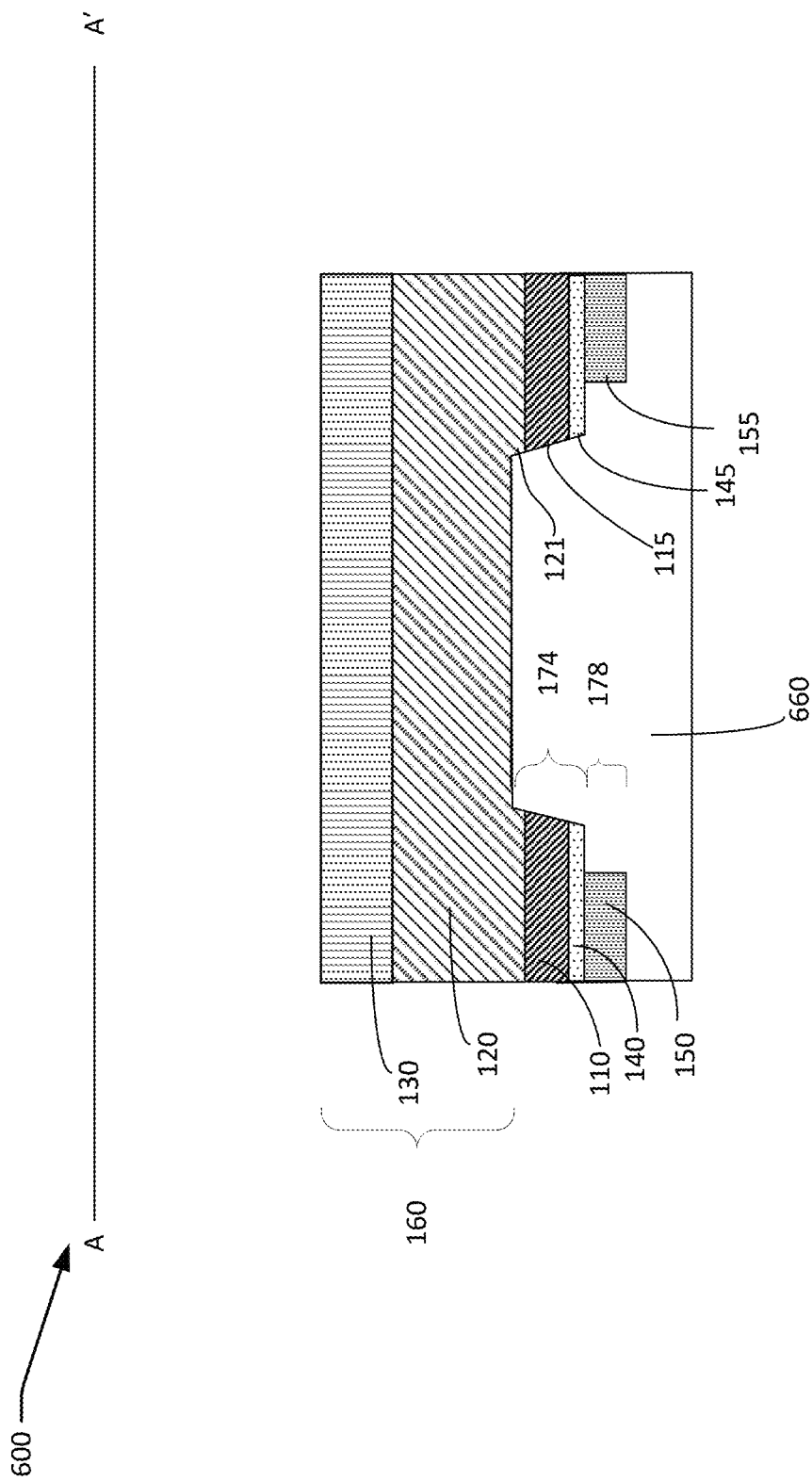

Referring to FIG. 6d, in one embodiment, the semiconductor wafer 110 with the passivation layers and BSM is reverse mounted onto a second dicing tape 660. As shown, the adhesive on the second dicing tape 660 may conform to the topography of the reverse-mounted wafer. The wafer mounted on the second dicing tape 660 may then be mounted onto a dicing ring. The dicing ring may be a metal or plastic material. The first dicing tape 165 is removed.

Figure 6E:
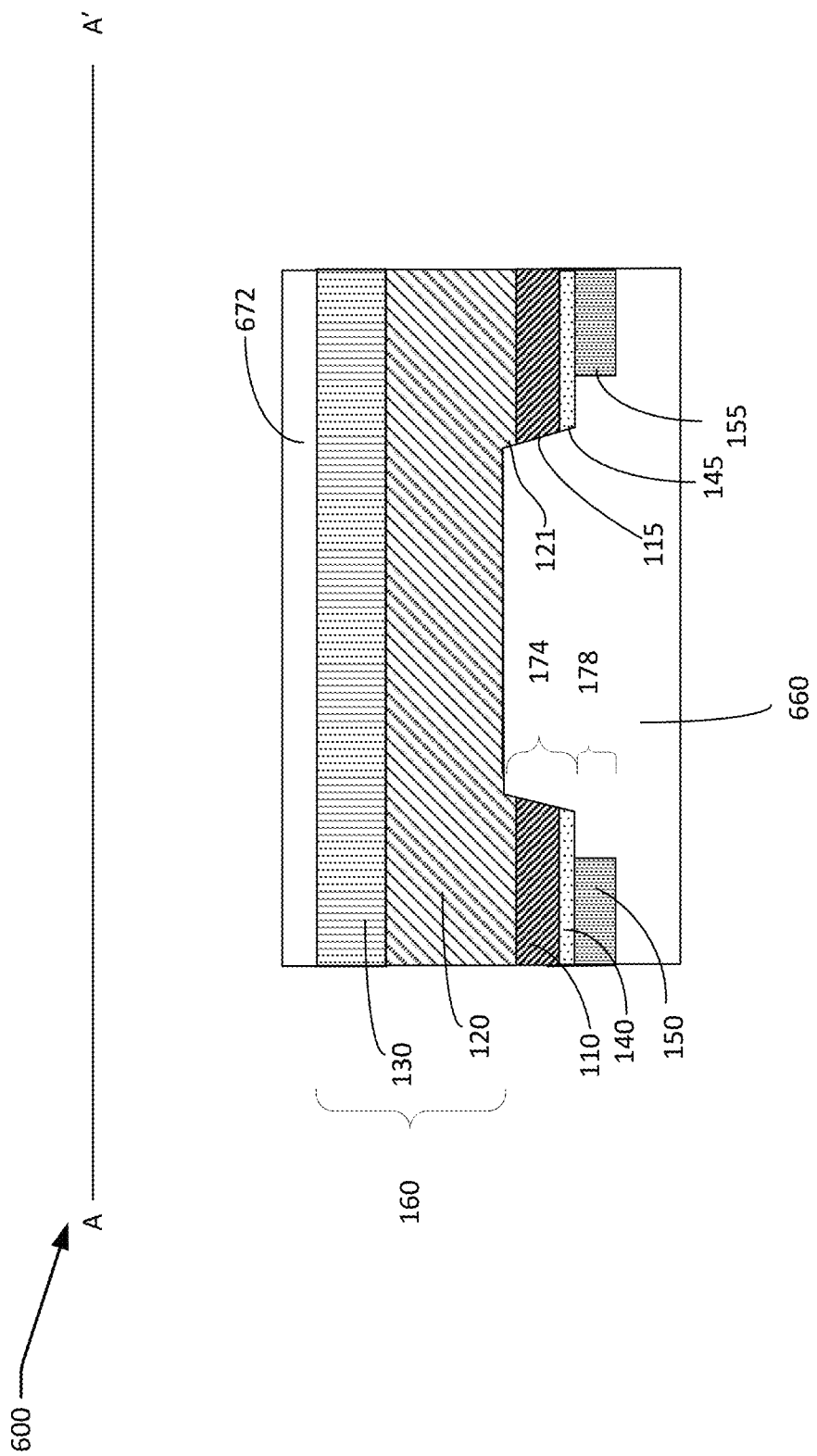

As shown in FIG. 6e, in one embodiment, a second protective layer 672 is formed over the bottom surface of the second metal layer 130. The second protective layer 672 may be a water-soluble coating material easily removed by deionized water, including but not limited to a hydro-carbon based polymer. For example, the second protective layer 672 may be the same material as the first protective layer 670. For example, the second protective layer 672 may be formed by techniques such as spin on or spraying. The protective layers may protect the BSM from forming heat affect zones from the laser.

Figure 6F:
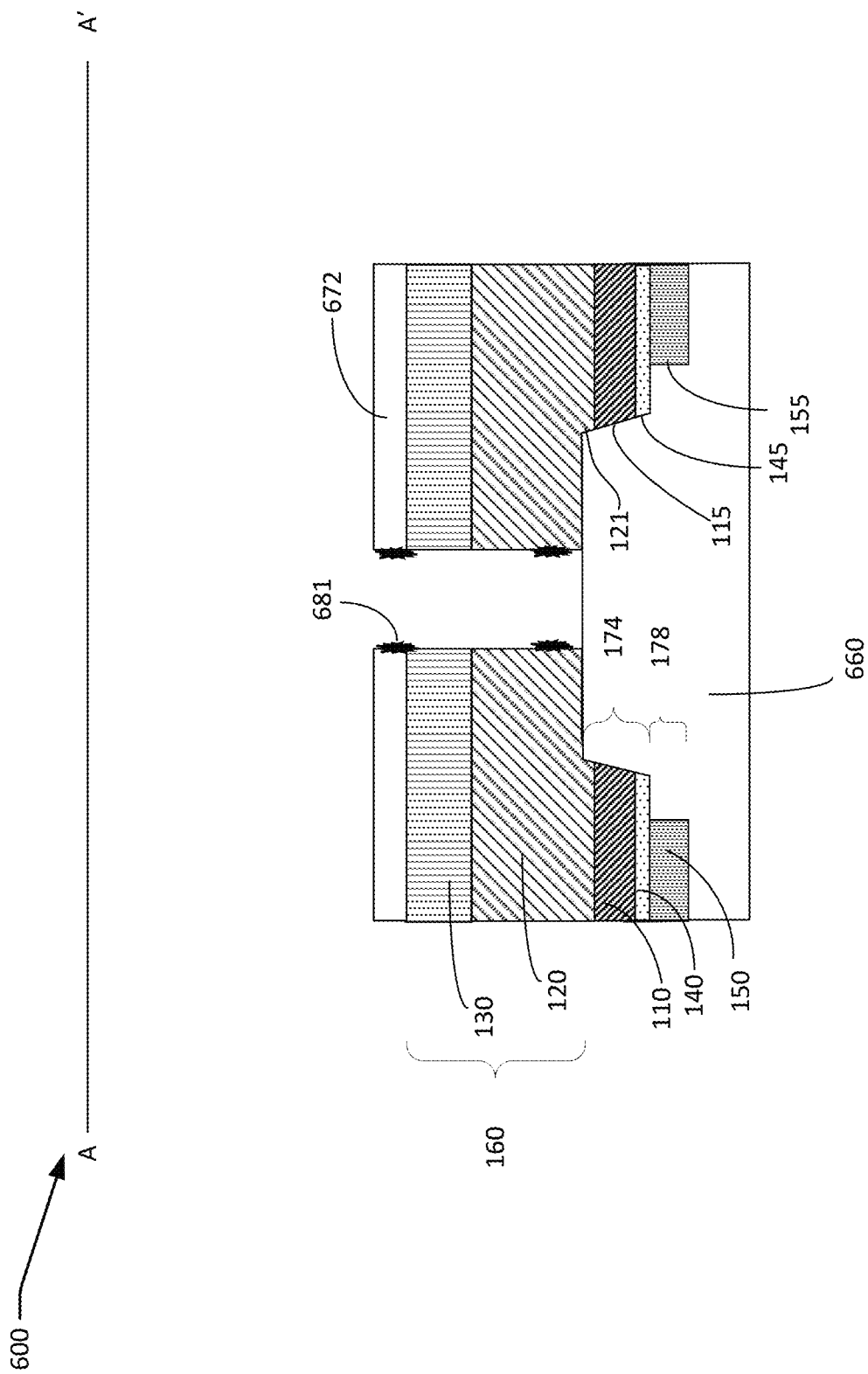

Referring to FIG. 6f, a cutting or dicing process is employed to cut the BSM 160 to singulate the die packages. In one embodiment, the dicing process is a laser etching process. The laser etches the BSM, in one embodiment, from the wafer backside, forming vertical or substantially vertical sidewalls for the BSM. The laser dicing process is narrower than the laser grooving process. This results in the sidewalls of the first passivation layer and wafer being recessed from the sidewalls of the BSM.

The laser dicing process causes metal debris 681 to be deposited on sidewalls of the BSM near the interface of the second metal layer 130 and second protective layer 672 and near the interface of the first metal layer 120 and the second dicing tape 660.

Figure 6G:
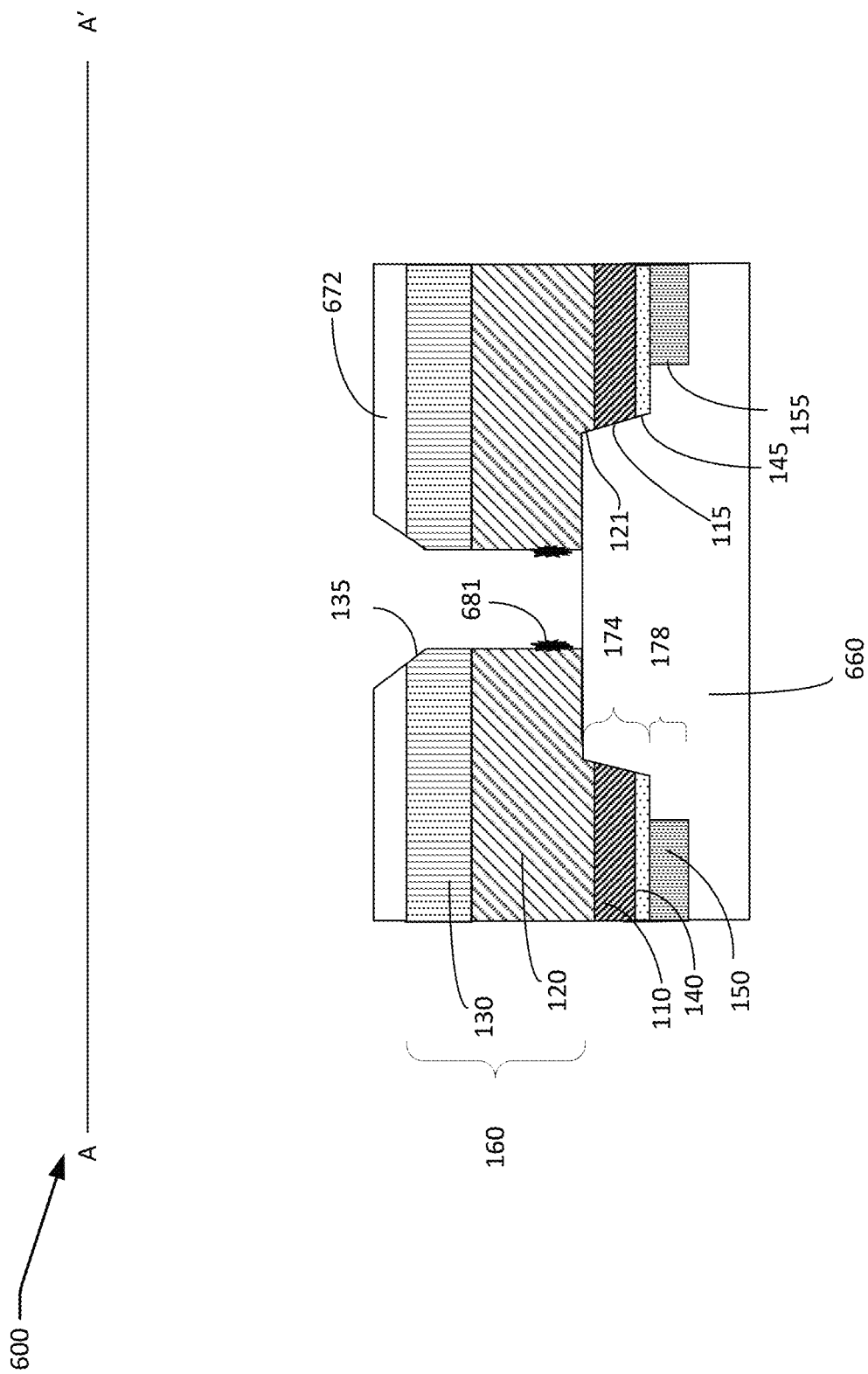

As shown in FIG. 6g, a deburring process is performed. For example, a second deburring process may be performed. The second deburring process may be similar or the same as the first deburring process. For example, the second deburring process may be a laser deburring process. Other types of deburring process may also be employed. The second deburring process forms deburred surfaces 135 on the sidewalls of the BSM. The deburred surfaces 135, for example, may be formed on the lower portion of the BSM, such as the lower portion of the second metal layer 130 of the BSM and the second protective layer 672. The deburred surfaces are beveled or slanted surfaces, creating a slanted or beveled sidewall profile in the lower part of the BSM.

Figure 6H:
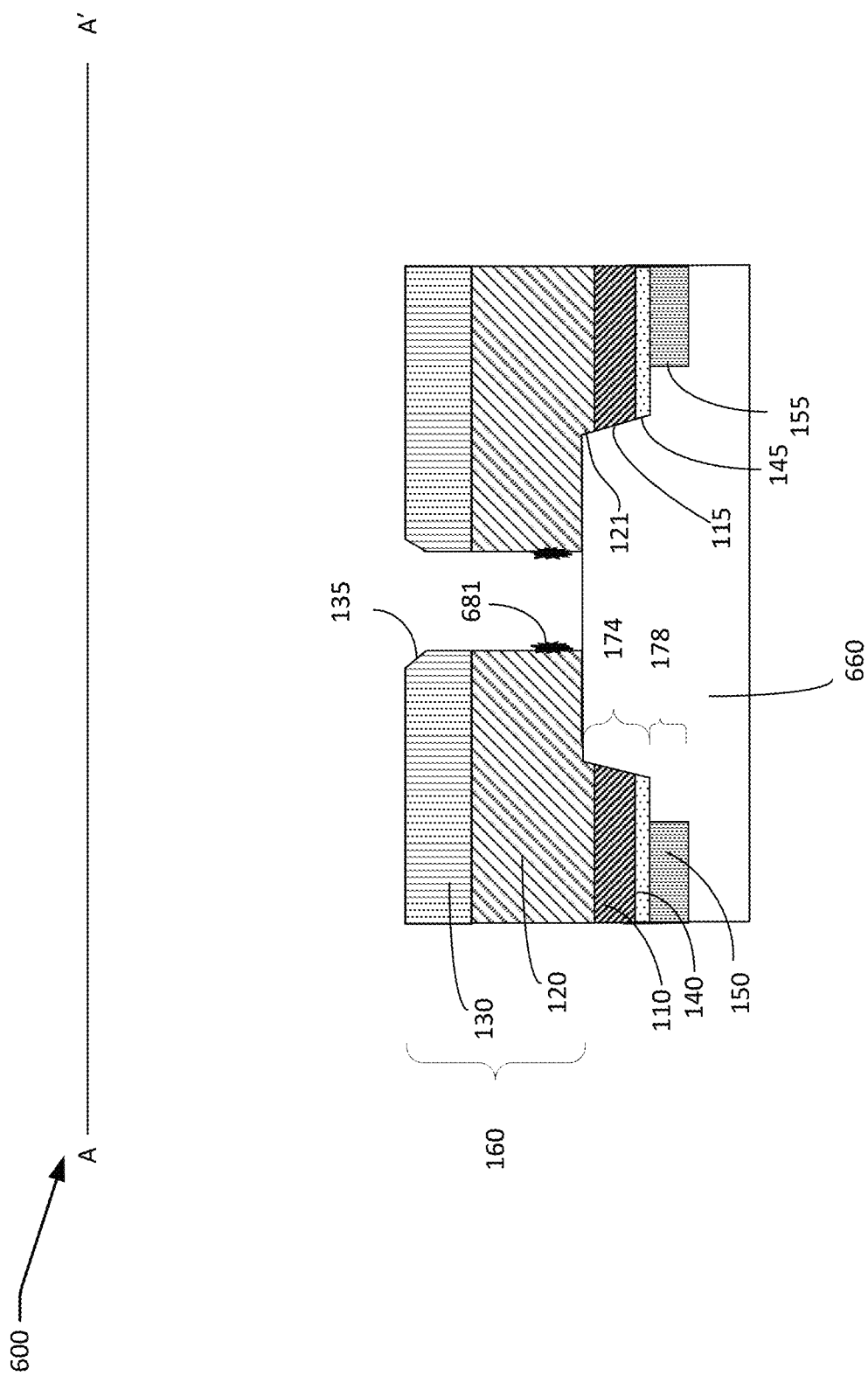

As shown in FIG. 6h, after the second deburring process, the second protective layer may be removed, for example, by a clean process using deionized water. Other removal processes may also be useful.

Figure 6I:
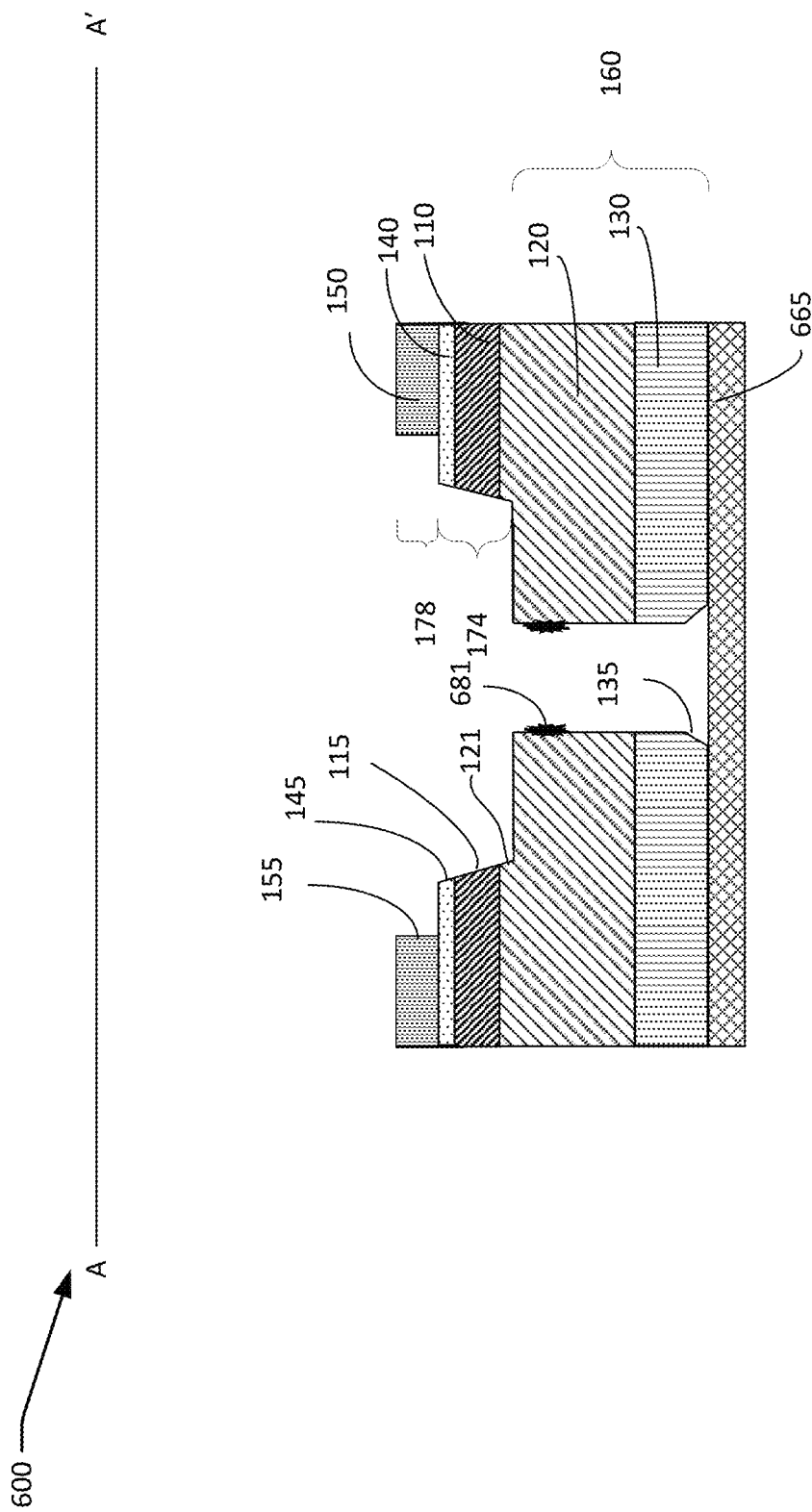

Referring to FIG. 6i, in one embodiment, the resulting structure is reverse mounted onto a third dicing tape 665 with the bottom surface of the second metal layer 130 adhered to the third dicing tape 665. The second dicing tape 660 may be then removed.

Figure 6J:
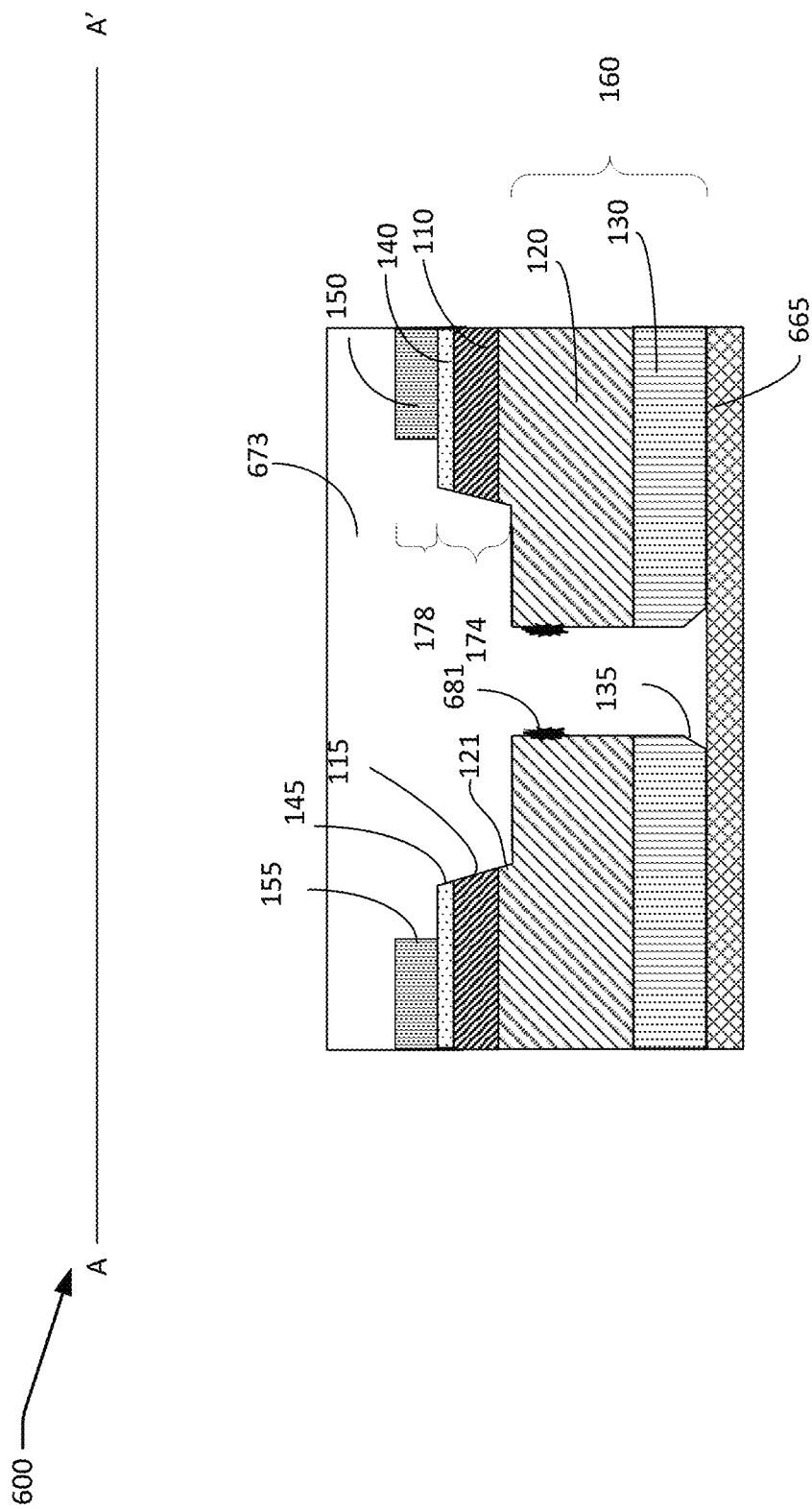

As shown in FIG. 6j, in one embodiment, a protective layer is formed over the wafer. For example, a third protective layer 673 may be formed over the wafer. The third protective layer covers the wafer surface and fills the openings therein. The protective layer, for example, may be a self-planarizing layer. This results in a planar surface over the wafer surface. The third protective layer 673 may be similar or the same as the first protective layer. For example, the third protective layer 673 may be a water-soluble coating material easily removed by deionized water. The third protective layer 673 may include a hydro-carbon based polymer. Other types of protective layers may also be useful. The third protective layer 673 may be formed by techniques such as spin on or spraying.

Figure 6K:
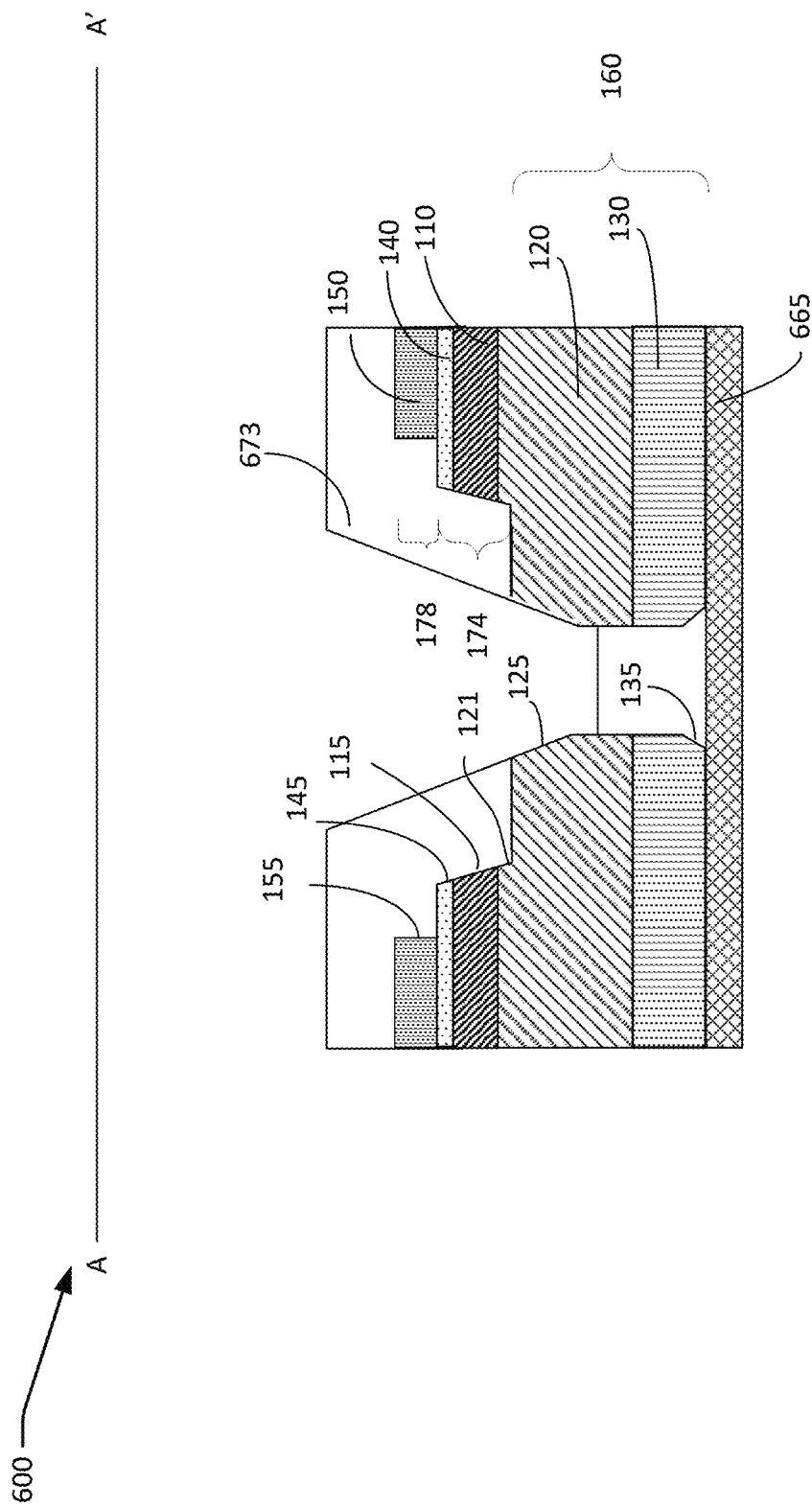
Figure 6I:
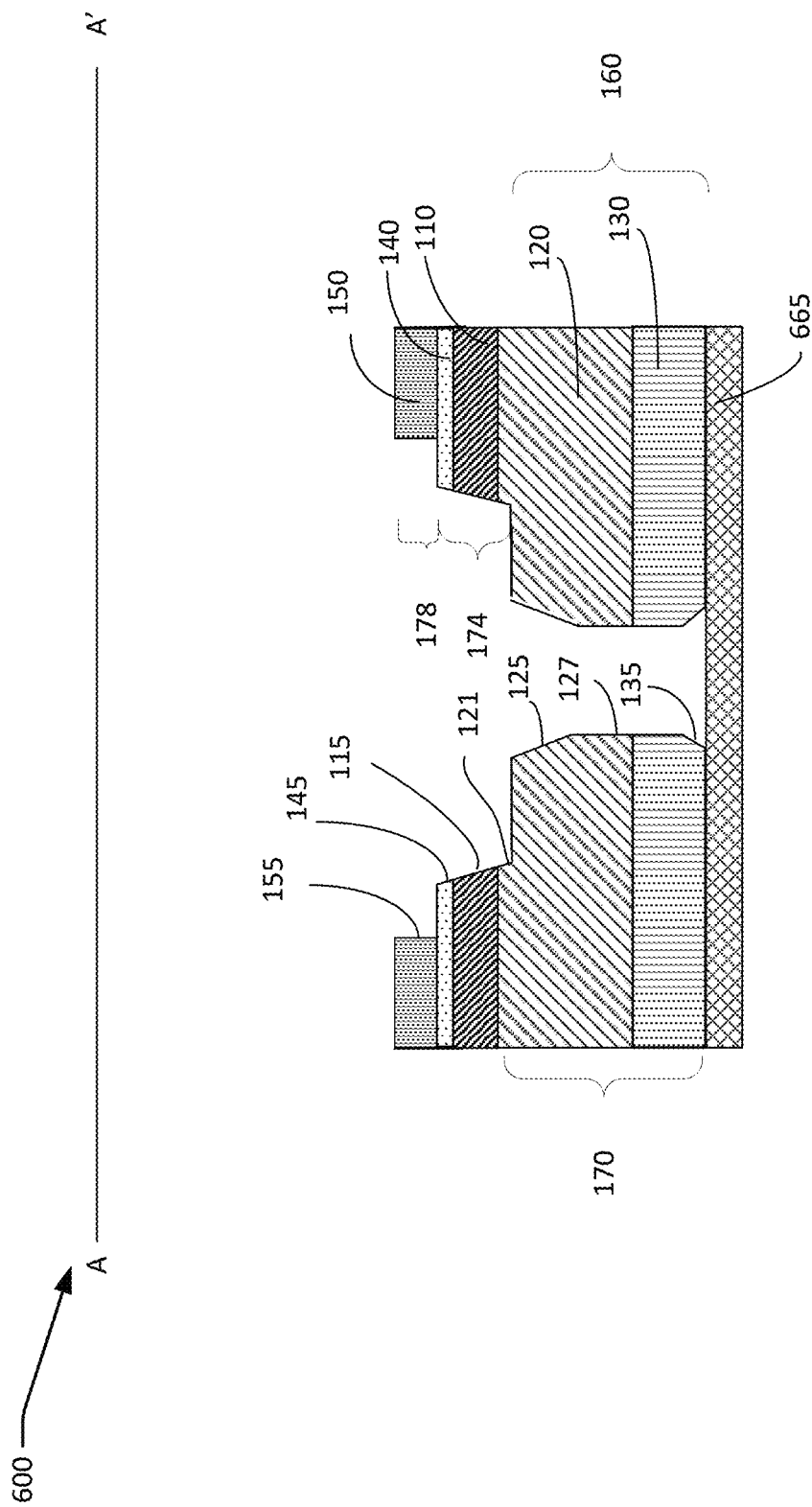

Referring to FIG. 6k, in one embodiment, a deburring process is performed. For example, a third deburring process may be performed. The third deburring process may be similar or the same as the first deburring process. For example, the third deburring process may be a laser deburring process. Other types of deburring process may also be employed. The third deburring process forms deburred surfaces 125 on the sidewalls of the BSM. The deburred surfaces 135, for example, may be formed on the upper portion of the BSM, such as the upper portion of the first metal layer 120 of the BSM and the third protective layer 673. The deburred surfaces are beveled or slanted surfaces, creating a slanted or beveled sidewall profile in the upper part of the BSM.

As shown in FIG. 6l, after the third deburring process, the third protective layer 673 may be removed, for example, by a clean process using deionized water. Other removal processes may also be useful. The lower part of the first metal layer 120 and the upper part of the second metal layer 130 may include vertical or substantially vertical sidewalls 127. The slanted sidewall 125 of the upper part of the first metal layer 120 slants outwardly and the slanted sidewall 135 of the lower part of the second metal layer 130 slants inwardly. The deburred (beveled or slanted) and vertical or substantially vertical surfaces of the BSM serve as the bottom portion 170 of the sidewall profiles.

Figure 6M:
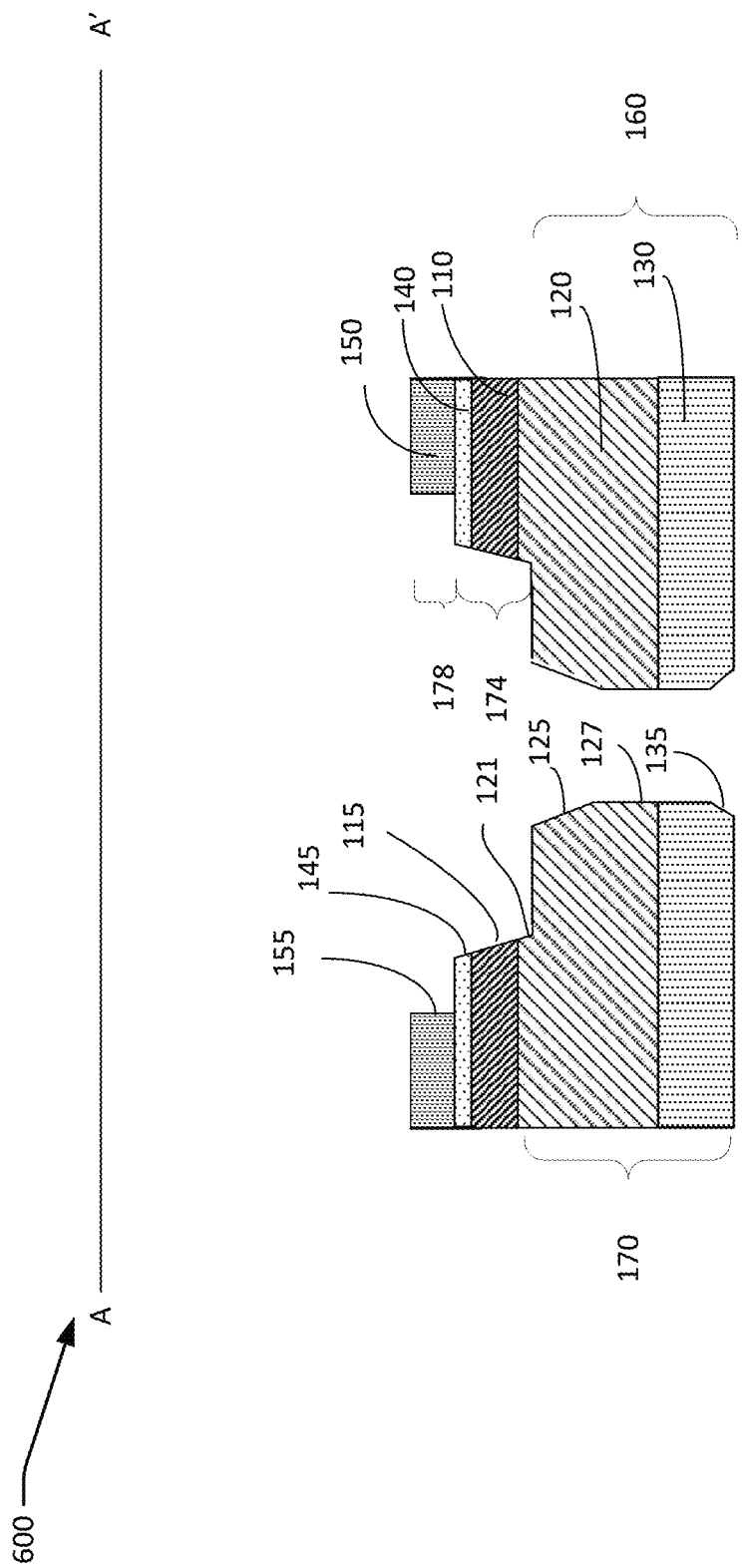

Referring to FIG. 6m, after dicing, the dicing tape is removed. This completes the singulation process of the die packages. As shown, the singulation process results in die packages without metal debris.

In another embodiment, a process for forming a semiconductor package similar to the one illustrated in FIG. 2e is performed by carrying out the steps described in FIGS. 6a-6i. The metal debris remaining on the sidewall of the BSM may not impose any issue on the device as it is far from the wafer sidewall and active surface of the die.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A semiconductor package comprising:
a die having a top die surface, a bottom die surface and die sidewall surfaces, wherein the bottom die surface comprises a backside wafer surface on which the die is formed, the top die surface comprises an active surface of the die
a passivation layer over the top die surface
backside metallization (BSM) on the bottom die surface, wherein
die sidewalls and passivation sidewalls of the passivation layer are recessed from BSM sidewalls of the BSM,
a top portion of the BSM sidewalls comprises deburred top BSM portions of the BSM sidewalls, wherein the deburred top BSM portions of the BSM sidewalls comprise beveled top BSM sidewall surfaces, and
sidewall profiles of the semiconductor package are defined by the BSM sidewalls, die sidewalls and passivation sidewalls.

2. The semiconductor package in claim 1 wherein the beveled BSM sidewall surfaces are devoid of metal debris.

3. The semiconductor package in claim 1 wherein:
the passivation layer comprises a passivation stack with first and second passivation layers,
the first passivation layer is disposed on the top die surface, and
the second passivation layer is disposed on the first passivation layer;
the first passivation layer comprises deburred first passivation sidewalls, the deburred first passivation sidewalls comprise first passivation beveled surfaces, wherein a bottom of the first passivation sidewalls is aligned with the bottom die sidewalls; and
the second passivation layer comprises vertical second passivation sidewalls, the second passivation sidewalls are recessed from the first passivation sidewalls.

4. The semiconductor package in claim 3 wherein the die sidewalls comprise deburred die sidewalls, the deburred die sidewalls are beveled die sidewall surfaces.

5. The semiconductor package in claim 3 wherein the die sidewalls comprise vertical die sidewalls.

6. The semiconductor package in claim 1 wherein the top and bottom portions of the BSM sidewalls comprise deburred BSM portions of the BSM sidewalls, wherein the deburred BSM portions of the BSM sidewalls comprise beveled BSM sidewall surfaces.

7. The semiconductor package in claim 1 wherein the top portion of the BSM sidewalls comprises deburred BSM sidewalls, wherein the deburred BSM sidewalls comprise beveled BSM sidewall surfaces.

8. The semiconductor package in claim 6 wherein the bottom portion of the BSM sidewalls comprises deburred BSM sidewalls, wherein the deburred BSM sidewalls comprise beveled BSM sidewall surfaces.

9. A semiconductor package comprising:
a substrate with a first surface, a second surface and sidewalls; and
a first passivation layer over the first surface of the substrate and a second passivation layer over the first passivation layer, wherein the first surface of the substrate includes an active surface;
backside metallization (BSM) over the second surface of the substrate, wherein a sidewall profile of the semiconductor package includes a deburred surface; and wherein sidewalls of the second passivation layer serve as a top portion of sidewall profiles of the semiconductor package, sidewalls of the first passivation layer and the substrate serve as an intermediate portion of the sidewall profiles of the semiconductor package, and sidewalls of the BSM serve as a bottom portion of the sidewall profiles of the semiconductor package, wherein the top portion is recessed from the intermediate portion and the intermediate portion is recessed from the bottom portion.

10. A semiconductor package comprising:

a die having a top die surface, a bottom die surface and die sidewall surfaces, wherein the bottom die surface comprises a backside wafer surface on which the die is formed, the top die surface comprises an active surface of the die;

backside metallization (BSM) on the bottom die surface, wherein die sidewalls are recessed from BSM sidewalls of the BSM, a top portion of the BSM sidewalls comprises deburred top BSM portions of the BSM sidewalls, wherein the deburred top BSM portions of the BSM sidewalls comprise top portion beveled BSM sidewall surfaces, and sidewall profiles of the semiconductor package are defined by the BSM sidewalls and die sidewalls; and wherein the deburred top BSM portions of the BSM sidewalls of the semiconductor package are devoid of metal debris.

11. The semiconductor package in claim 10 wherein the deburred BSM potions of the BSM sidewalls comprise laser deburred surfaces.

12. The semiconductor package in claim 10 wherein:

the top die surface comprises a passivation layer with passivation sidewalls of the passivation layer, the passivation sidewalls are aligned with the die sidewalls; and the passivation sidewalls comprise deburred passivation sidewalls, the deburred passivation sidewalls are beveled passivation sidewall surfaces.

13. The semiconductor package in claim 12 wherein a bottom portion of the BSM sidewalls comprises deburred bottom BSM portions of the BSM sidewalls, wherein the deburred bottom BSM portions of the BSM sidewalls comprise bottom portion beveled BSM sidewall surfaces.

14. The semiconductor package in claim 13 wherein the die sidewalls comprise deburred die sidewalls, the deburred die sidewalls are beveled die sidewall surfaces.

15. The semiconductor package in claim 10 wherein a bottom portion of the BSM sidewalls comprises deburred bottom BSM portions of the BSM sidewalls, wherein the deburred bottom BSM portions of the BSM sidewalls comprise bottom portion beveled BSM sidewall surfaces.

16. The semiconductor package in claim 15 wherein the die sidewalls comprise vertical die sidewalls.

17. The semiconductor package in claim 10 wherein:

the top die surface comprises a passivation stack with a first passivation layer on the top die surface and a second passivation layer on the first passivation layer;

first passivation sidewalls of the first passivation layer comprise deburred first passivation sidewalls, the deburred first passivation sidewalls are beveled first passivation sidewall surfaces; and second passivation sidewalls of the first passivation layer are recessed from the first passivation sidewalls, the second passivation sidewalls are vertical second passivation sidewalls.

18. The semiconductor package in claim 17 wherein a bottom portion of the BSM sidewalls comprises deburred bottom BSM portions of the BSM sidewalls, wherein the deburred bottom BSM portions of the BSM sidewalls comprise bottom portion beveled BSM sidewall surfaces.

19. The semiconductor package in claim 17 wherein:

the BSM comprises first and second metal layers, the first metal layer is disposed on the bottom die surface and the second metal layer is disposed on the first metal layer; and wherein the deburred top BSM portions of the BSM sidewalls are at an upper first metal layer sidewall portion of the first metal layer.

20. The semiconductor package in claim 19 wherein a lower portion of sidewalls of the second metal layer includes deburred surfaces.

* * * * *